(12) United States Patent
Seok

(10) Patent No.: US 10,535,760 B2
(45) Date of Patent: *Jan. 14, 2020

(54) IGBT DIE STRUCTURE WITH AUXILIARY P WELL TERMINAL

(71) Applicant: Littelfuse, Inc., Chicago, IL (US)

(72) Inventor: Kyoung Wook Seok, Milpitas, CA (US)

(73) Assignee: LITTELFUSE, INC., Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/876,184

(22) Filed: Jan. 21, 2018

(65) Prior Publication Data

US 2018/0145162 A1 May 24, 2018

Related U.S. Application Data

(63) Continuation of application No. 13/662,384, filed on Oct. 26, 2012, now Pat. No. 9,911,838.

(51) Int. Cl.
*H01L 29/20* (2006.01)
*H01L 29/739* (2006.01)
(Continued)

(52) U.S. Cl.
CPC ........ *H01L 29/7395* (2013.01); *H01L 23/495* (2013.01); *H01L 23/49562* (2013.01);
(Continued)

(58) Field of Classification Search
CPC ..... H01L 29/7395; H01L 24/06; H01L 24/49; H01L 29/1095; H01L 23/495;
(Continued)

(56) References Cited

U.S. PATENT DOCUMENTS 4,618,872 A 10/1986 Baliga ........................... 257/140
4,620,211 A 10/1986 Baliga et al. ................. 257/142
(Continued)

OTHER PUBLICATIONS

Sawant et al., "Current Saturation Control In Silicon Emitter Switched Thyristors," Solid-State Electronics, vol. 44, No. 1 (2000), Aug. 4, 1999, pp. 133-142 (10 pages).
(Continued)

*Primary Examiner* — Mohammad M Hoque

(57) ABSTRACT

An IGBT die structure includes an auxiliary P well region. A terminal, that is not connected to any other IGBT terminal, is coupled to the auxiliary P well region. To accelerate IGBT turn on, a current is injected into the terminal during the turn on time. The injected current causes charge carriers to be injected into the N drift layer of the IGBT, thereby reducing turn on time. To accelerate IGBT turn off, charge carriers are removed from the N drift layer by drawing current out of the terminal. To reduce $V_{CE(SAT)}$, current can also be injected into the terminal during IGBT on time. An IGBT assembly involves the IGBT die structure and an associated current injection/extraction circuit. As appropriate, the circuit injects or extracts current from the terminal depending on whether the IGBT is in a turn on time or is in a turn off time.

19 Claims, 21 Drawing Sheets

IGBT WITH CHARGE CARRIER INJECTION/EXTRACTION STRUCTURE

(51) Int. Cl.
  *H01L 23/495* (2006.01)
  *H01L 23/00* (2006.01)
  *H01L 29/417* (2006.01)
  *H01L 29/66* (2006.01)
  *H01L 29/06* (2006.01)
  *H01L 29/10* (2006.01)
  *H01L 29/423* (2006.01)
  *H01L 29/08* (2006.01)
  *H01F 38/30* (2006.01)

(52) U.S. Cl.
  CPC .............. *H01L 24/06* (2013.01); *H01L 24/49* (2013.01); *H01L 29/0696* (2013.01); *H01L 29/0834* (2013.01); *H01L 29/1095* (2013.01); *H01L 29/41741* (2013.01); *H01L 29/4238* (2013.01); *H01L 29/66333* (2013.01); *H01F 38/30* (2013.01); *H01L 24/48* (2013.01); *H01L 2224/04042* (2013.01); *H01L 2224/0603* (2013.01); *H01L 2224/0616* (2013.01); *H01L 2224/45099* (2013.01); *H01L 2224/4813* (2013.01); *H01L 2224/48091* (2013.01); *H01L 2224/48105* (2013.01); *H01L 2224/48177* (2013.01); *H01L 2224/48247* (2013.01); *H01L 2224/48265* (2013.01); *H01L 2224/48472* (2013.01); *H01L 2224/49096* (2013.01); *H01L 2224/49111* (2013.01); *H01L 2224/49175* (2013.01); *H01L 2224/49176* (2013.01); *H01L 2224/73265* (2013.01); *H01L 2924/00014* (2013.01); *H01L 2924/12036* (2013.01); *H01L 2924/13055* (2013.01); *H01L 2924/181* (2013.01); *H01L 2924/19104* (2013.01); *H01L 2924/19107* (2013.01)

(58) Field of Classification Search
  CPC .............. H01L 29/0834; H01L 29/0696; H01L 23/49562; H01L 29/41741; H01L 29/66333; H01L 29/4238; H01L 2224/73265; H01L 2224/48177; H01L 2924/12036; H01L 2224/04
  See application file for complete search history.

(56) References Cited

U.S. PATENT DOCUMENTS

| | | | |
|---|---|---|---|
| 4,743,952 A | 5/1988 | Baliga | |
| 4,888,627 A | 12/1989 | Pattanayak et al. | 257/113 |
| 5,124,772 A | 6/1992 | Hideshima et al. | 257/110 |
| 5,168,331 A | 12/1992 | Yilmaz | 257/331 |
| 5,198,687 A | 3/1993 | Baliga | 257/137 |
| 5,293,054 A | 3/1994 | Shekar et al. | 257/152 |
| 5,296,725 A | 3/1994 | Nandakumar et al. | |
| 5,306,930 A | 4/1994 | Baliga | 257/147 |
| 5,317,171 A | 5/1994 | Shekar et al. | 257/138 |
| 5,319,222 A | 6/1994 | Shekar et al. | 257/138 |
| 5,381,026 A | 1/1995 | Shinohe et al. | 257/147 |
| 5,412,228 A | 5/1995 | Baliga | 257/133 |
| 5,488,236 A | 1/1996 | Baliga et al. | 257/132 |
| 5,674,766 A | 10/1997 | Darwish et al. | 438/270 |
| 5,705,835 A * | 1/1998 | Nishiura | H01L 29/7455 257/107 |
| 5,821,580 A | 10/1998 | Kuwahara | 257/330 |
| 5,912,497 A | 6/1999 | Baliga | 257/366 |
| 6,002,153 A | 12/1999 | Tsunoda et al. | 257/341 |
| 6,114,727 A | 9/2000 | Ogura et al. | |
| 6,124,628 A | 9/2000 | Fujihira et al. | 257/630 |
| 6,462,380 B1 | 10/2002 | Duvvury et al. | 257/355 |
| 8,686,513 B1 | 4/2014 | Seok | 257/379 |
| 2003/0142539 A1 | 7/2003 | Matsukawa et al. | |
| 2004/0022041 A1 | 2/2004 | Bergmann et al. | |
| 2005/0156231 A1 | 7/2005 | Okuno et al. | 257/328 |
| 2006/0118818 A1 | 6/2006 | Shimoida et al. | 257/183 |
| 2006/0237793 A1 | 10/2006 | Nadd et al. | 257/355 |
| 2007/0194346 A1 | 8/2007 | Nagase et al. | |
| 2008/0296771 A1 | 12/2008 | Das et al. | |
| 2009/0020852 A1 | 1/2009 | Harada | 257/579 |
| 2009/0230500 A1 | 9/2009 | Yoshikawa et al. | 257/470 |
| 2010/0059028 A1 | 3/2010 | Ueno | 123/652 |
| 2010/0219517 A1* | 9/2010 | Yoshiba | H01L 21/565 257/676 |
| 2010/0230401 A1* | 9/2010 | Miyauchi | H05B 6/062 219/665 |
| 2011/0024883 A1 | 2/2011 | Sakai | |
| 2011/0058400 A1 | 3/2011 | Fukuta et al. | |
| 2011/0062490 A1 | 3/2011 | Oh et al. | 257/140 |
| 2011/0103099 A1* | 5/2011 | Moki | H02M 7/1626 363/17 |
| 2011/0140167 A1 | 6/2011 | Yilmaz et al. | 257/139 |
| 2011/0156096 A1 | 6/2011 | Udrea et al. | |
| 2012/0025264 A1 | 2/2012 | Kouno | |
| 2012/0092116 A1 | 4/2012 | Ger et al. | |
| 2012/0099234 A1 | 4/2012 | Inoue et al. | |
| 2012/0139640 A1 | 6/2012 | Cortes et al. | |
| 2012/0326277 A1 | 12/2012 | Lee et al. | 257/607 |
| 2013/0106469 A1 | 5/2013 | Slavov | 327/109 |
| 2013/0109110 A1 | 5/2013 | Sasaki et al. | |

OTHER PUBLICATIONS

Wittig, B.; Fuchs, F.W., "Current injection gate drive circuit for controlling the turn-off characteristic of low voltage power MOSFETs with high current ratings", Industrial Electronics (ISIE), 2010 IEEE International Symposium on, vol., No., pp. 767,771, Jul. 4-7, 2010.

* cited by examiner

SYMBOL OF N-CHANNEL
ENHANCEMENT TYPE IGBT

IGBT

IGBT WITH HOLE DIVERTER

IGBT

SYMBOL OF N-CHANNEL ENHANCEMENT TYPE IGBT WITH
CHARGE CARRIER INJECTION/EXTRACTION TERMINAL

IGBT WITH CHARGE CARRIER
INJECTION/EXTRACTION STRUCTURE

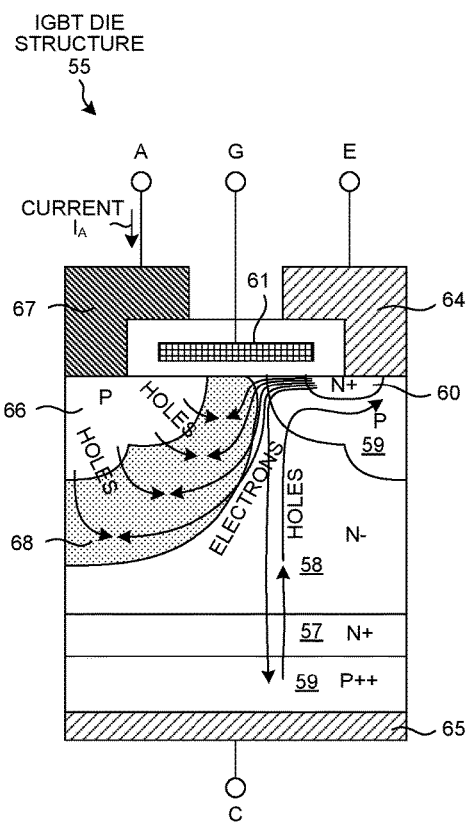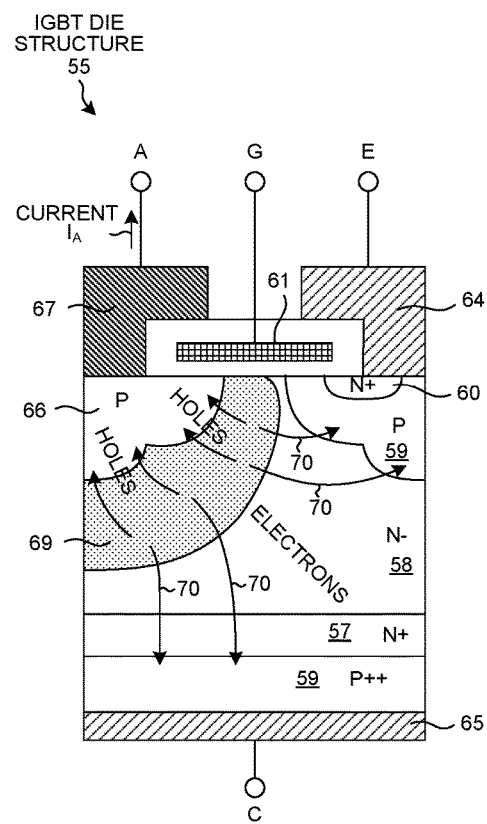
FIG. 7 — CARRIER INJECTION BY AUXILIARY P WELL DURING TURN ON TIME
FIG. 8 — CARRIER EXTRACTION BY AUXILIARY P WELL DURING TURN OFF TIME

TOP-DOWN VIEW OF UNIT CELL
WITH GATE POLY

CROSS-SECTIONAL SIDE VIEW
ALONG LINE A-A OF FIG. 9A

TOP-DOWN VIEW OF UNIT CELL
(WITH GATE POLY REMOVED)

CROSS-SECTIONAL SIDE VIEW
ALONG LINE A-A OF FIG. 10A

TOP-DOWN VIEW OF UNIT CELL
WITH OXIDE OVER POLY GATE

CROSS-SECTIONAL SIDE VIEW
ALONG LINE A-A OF FIG. 11A

TOP-DOWN VIEW OF UNIT CELL
WITH GATE POLY

CROSS-SECTIONAL SIDE VIEW
ALONG LINE A-A OF FIG. 12A

TOP-DOWN VIEW OF UNIT CELL
WITH GATE POLY

CROSS-SECTIONAL SIDE VIEW
ALONG LINE A-A OF FIG. 13A

TOP-DOWN VIEW OF UNIT CELL
WITH GATE POLY

CROSS-SECTIONAL SIDE VIEW
ALONG LINE A-A OF FIG. 14A

FIRST METAL LAYER

FIRST LAYER METAL ON POLY LAYER

SECOND LAYER METAL

SECOND LAYER METAL ON FIRST LAYER METAL

EMITTER CURRENT FLOWING OUT OF
EMITTER PAD CAUSES ENERGY TO BE
STORED IN CURRENT TRANSFORMER

THE CURRENT TRANSFORMER CAUSES AUXILIARY
CURRENT TO FLOW BACK INTO AUXILIARY PAD

PERSPECTIVE DIAGRAM OF
CURRENT TRANSFORMER

CROSS-SECTIONAL DIAGRAM OF
CURRENT TRANSFORMER

CURRENT TRANSFORMER WITHIN A THREE-
TERMINAL PACKAGED IGBT
(ENCAPSULANT NOT SHOWN)

IGBT WITH CHARGE CARRIER INJECTION/EXTRACTION AND
BUILT IN CURRENT TRANSFORMER

WAVEFORMS FOR IGBT WITHOUT AUXILIARY P TYPE
WELL AND WITHOUT CURRENT TRANSFORMER

IGBT DIE STRUCTURE WITH AUXILIARY P WELL TERMINAL

CROSS REFERENCE TO RELATED APPLICATIONS

This application is a continuation of, and claims priority under 35 U.S.C. § 120 from, nonprovisional U.S. patent application Ser. No. 13/662,384 entitled "IGBT Die Structure With Auxiliary P Well Terminal," filed on Oct. 26, 2012, now U.S. Pat. No. 9,911,838, the subject matter of which is incorporated herein by reference.

TECHNICAL FIELD

The described embodiments relate to Insulated Gate Bipolar Transistors (IGBTs).

BACKGROUND INFORMATION

FIG. 1 (Prior Art) is a symbol of an N-channel enhancement type Insulated Gate Bipolar Transistor (IGBT). There are several symbols in use for such an IGBT. FIG. 1 is but one of these symbols. Whereas in a power field effect transistor structure the current flow between drain and source is due primarily to the flow of majority carriers, in an IGBT structure the current flow between collector and emitter is due both to majority carrier flow and to minority carrier flow. Accordingly, for a given semiconductor die area, an IGBT can generally switch a larger current than a power field effect transistor of the same semiconductor die area. IGBTs are therefore preferable for certain applications. The IGBT symbol 1 includes a gate terminal 2, an emitter terminal 3, and a collector terminal 4.

FIG. 2 (Prior Art) is a simplified cross-sectional diagram of an IGBT. Epitaxial layers 6 and 7 are grown on a P++ type substrate layer 5. N+ type buffer layer 6 is disposed on the P++ type substrate layer 5. N− type drift layer 7 is disposed on the N+ type buffer layer 6. A P type body region 8 extends down into the N− type drift layer 7, and an N+ type source region 9 extends down into the P body region 8. There are several different topologies for an IGBT. The IGBT of FIG. 2 is one of these topologies. The P type body region shown on the left in the cross-section of the particular topology of FIG. 2 is part of the P type body region 8 on the right. A gate 10, such as a gate of polysilicon material, is separated from the planar upper semiconductor surface by a thin gate insulation layer 11. An emitter metal terminal 12 straps each P type body region to its corresponding N+ type source region as shown. A collector metal terminal 13 is disposed on the bottom side of the P++ type substrate layer 5. A gate terminal (not shown) is provided to make contact with the gate.

The IGBT can be considered to have a field effect transistor portion and a bipolar transistor portion. If the voltage $V_{CE}$ between the collector and the emitter is negative, then the P++ substrate to N− drift junction is reverse biased. Due the reverse biasing of this junction, there is no current flow between the collector and emitter. The IGBT is off and nonconductive. This condition is referred to as the "reverse blocking mode". The term "reverse" is due to the P++ substrate to N− drift junction being reverse biased.

If the collector-to-emitter voltage $V_{CE}$ is positive, and if the voltage $V_{GE}$ between the gate and the emitter is less than a threshold voltage $V_{TH}$ (for example, $V_{GE}$ is zero volts), then there is also no current flow between the collector and emitter. Due to the $V_{GE}$ being less than the threshold voltage $V_{TH}$ there is no conductive channel through the P type body region between the N+ type source region 9 and the N− type drift layer 7. Electrons cannot flow from the N+ type source region 9, through a conductive channel, and to the N− type drift layer, and on to the collector. Consequently there is no current flow between the collector and emitter. This condition is referred to as the "forward blocking mode".

If the collector-to-emitter voltage $V_{CE}$ is positive, and if the voltage $V_{GE}$ between the gate and the emitter is initially less than the threshold voltage $V_{TH}$ but is then raised to be greater than the threshold voltage $V_{TH}$ (for example, $V_{GE}$ is raised to fifteen volts), then a thin layer of the P type body region under the gate at the upper surface of the semiconductor material inverts and becomes a conductive channel. Under the influence of a positive collector-to-emitter voltage $V_{CE}$, electrons flow from N+ type source region 9, laterally through the conductive channel and across the P type body region, and to the portion of the N-type drift layer 7 under gate 10. Some of these electrons recombine with holes in the N-drift layer, but others continue downward through the N− type drift layer 7 and downward through the N+ buffer layer 6. The current flow passes through the P+− type substrate layer 5 and to the collector terminal 13. Arrows 14 and 15 indicate paths of these electrons into the N− type drift layer 7. The flow of electrons into the N− type drift layer 7 increases the concentration of electrons in the N− type drift layer 7, thereby reducing the potential of N− type drift layer 7. The reduced potential on the N− type drift layer 7 causes the PN junction between the P++ type substrate 5 and the N+ type buffer layer 6 to be more forward biases. Holes are therefore emitted from the P++ type substrate layer 5 into the N+ type buffer layer 5. These holes pass upward through N+ type drift layer 6. The holes that do not recombine with electrons in the N− type drift layer 7 pass through N− type drift layer 7, and enter P type body region 8. The holes do not flow into N+ type source region 9 so they pass under N+ type source region 9 and around the N+ type source region, and then upward to emitter terminal 12. Arrow 16 in FIG. 2 indicates a path of this hole current. The emission of holes from the P++ type substrate layer 5 into the N+ buffer layer 6 and into the N− type drift layer 7 also causes the concentration of holes in the N− type drift layer 7 to increase. This increase of the hole concentration in the N− type drift layer 7 causes more electrons to be drawn through the channel from the N+ type source region 9. The electrons are drawn through the channel and into the N− type drift layer 7 in an attempt to equalize charge in the N-type drift layer 7. A high density electron/hole "gas" exists in the N− type drift layer 7. Current flow between the emitter terminal and the collector terminal is therefore due both to electron flow into the N− type drift layer 7 as well as to hole flow into the N− type drift layer 7. Substantial collector-to-emitter current flows. This condition is referred to as the "forward conduction mode".

To turn the IGBT on, an amount of time is required for the high density electron/hole "gas" to be established in the N− type drift layer 7 by the processes described above. Similarly, for the IGBT to be turned off, an amount of time is required for the holes and the electrons of the high density electron/hole "gas" to be removed from the N− type drift layer 7 or for the holes and electrons of the "gas" to recombine.

Such an IGBT may, however, be susceptible to a phenomenon referred to as latchup. During normal operation in the forward conduction mode as explained above, the channel is conductive and electrons flow from the N+ source region 9, through the channel, to the N− type material under the gate, then down through the N− type drift layer 7 to the P++ type substrate 5. As explained above, this causes a flow of holes upward from the P++ type substrate 5, up through the N− type drift layer 7, and then laterally through the P type body region 9 under the N+ type source region 9, and to the emitter terminal 12. The electrons flowing from the N− type drift layer to the P++ type substrate is actually a base-to-emitter current of a PNP transistor, where the emitter of the PNP transistor is the P++ type substrate layer 5, where the base of the PNP transistor is the N− type drift layer 7 and the N+ type buffer layer 6, and where the collector of the PNP transistor is the P type body region 8. This PNP transistor is therefore on and conductive during normal operation in the forward conduction mode. In normal operation in the forward conduction mode, however, the IGBT can be turned off using the gate by stopping electron flow through the channel. Stopping electron flow through the channel eliminates the base current of the PNP transistor and turns the PNP transistor off.

In a latchup situation, however, the flow of holes passing laterally under the N+ type source region 9 is large. The P type body material through which these holes flow when they pass laterally under the N+ type source region 9 has a resistance. This resistance is indicated in FIG. 2 by the resistor symbol 17. If the flow of holes through this resistance 17 is great enough, then the voltage on a part of the P type body region 8 will rise with respect to the voltage on emitter terminal 12 and N+ type source region 9. This portion of the P type body region 8 that experiences the rise in voltage happens to be the base of a parasitic NPN transistor, where the N+ type material of the source region 9 is the emitter of the parasitic NPN transistor, and where the N− type drift layer 7 is the collector of the parasitic NPN transistor. The rise in voltage on the base of the parasitic NPN transistor due to hole flow is a base current and turns the parasitic NPN transistor on. The parasitic NPN transistor turns on and provides a second source of base current to the PNP transistor. The PNP transistor cannot then be turned off by the gate cutting electron flow through the channel because there is now a second source of base current for the PNP transistor through the parasitic NPN transistor. The PNP transistor therefore remains on regardless of the voltage on the gate. The PNP transistor in turn continues to supply holes that pass up into the P type body 8, and that then flow laterally under the N+ type source region 9, across resistance 17, and keep the parasitic NPN transistor turned on. The two transistors therefore keep each other turned on. This condition is referred to as latchup. Latchup can cause very large localized currents that can destroy an IGBT.

FIG. 3 (Prior Art) is a simplified cross-sectional diagram of an old IGBT structure that was sometimes employed in the past. A P type well region 18 referred to as a hole "diverter" was provided. In different implementations, this bottom of the diverter had different topologies. In some prior art designs, a PN diode diverter had a dynamic clamping behavior. In the example of FIG. 3, the diverter 18 has a bottom boundary topology that is similar to the topology of the bottom of P body region 8. When the IGBT is turned on in the forward conduction mode, electrons flow from the N+ source region 9, through the conductive channel, down through the N− type drift layer 7, and downward as described above. Similarly, as described above, holes are emitted from the P++ type substrate layer 5 and flow up to the P body region 8. In the structure of FIG. 3, however, some of these holes that are passing upward through N− type drift layer 7 are "diverted" to the left and flow into the P type diverter 18. Arrow 19 illustrates the path of these diverted holes. The diverted holes cause a current to flow from the diverter 18 and to the emitter terminal 12, but the diverted holes reduce the magnitude of hole current flowing under the N+ type source region 9. By diverting holes and reducing the magnitude of hole flow 16 through the resistance 17, the voltage rise on the base of the parasitic NPN transistor is reduced. Reducing the rise in the voltage on the base of the parasitic NPN transistor prevents the parasitic NPN transistor from turning on, and prevents latchup. The P type diverter 18 is coupled via emitter terminal 12 to P type body region 8 as shown so that if the voltage on a localized part of the P type body region were to start to rise due to a large lateral hole flow through resistance 17, then more holes would be diverted to the relatively lower voltage of the nearby diverter 18. The diverter structure may have reduced the susceptibility of the IGBT to latchup, but the presence of the diverters caused the $V_{CE(SAT)}$ of the IGBT to be larger. Having a low $V_{CE(SAT)}$ is a very important quality of an IGBT in many applications. The diverter structure of the past is therefore seldom if ever seen in commercial IGBTs.

In contemporary IGBTs, various techniques are employed to prevent latchup. FIG. 4 (Prior Art) is a diagram of an IGBT that is designed using some of these techniques. The contour of the P type body region to N− drift layer is different as compared to the P type body to N− type drift boundary of many prior IGBTs, and the doping profile within the P type body region is tailored by careful control of dopant implanting, such that some of the holes flowing up from the P++ type substrate in the forward conduction mode enter the P-body region at a lower location on the P type body to N− type drift boundary. Arrow 20 in FIG. 4 illustrates this diverted current flow. This diverted current flow reduces the amount of current that flows through resistance 17 directly under the N+ source region. The hole current is spread out in the P type material of the P type body region. Moreover, the resistivity of at least some of the P type material through which the hole current flows in the deeper parts of the P type body region is made to be lower than the resistivity of the P type material directly underneath the N+ type source. In some prior art devices, a floating P well is provided. This P well is floating and is not connected to any terminal. The floating P well serves to increase breakdown voltage of the IGBT. Due to a combination of all these factors and techniques, in contemporary IGBT structures there is no localized voltage drop in the P type body region sufficient to turn on the NPN parasitic transistor. Latchup is therefore avoided and suitably large breakdown voltages are achieved.

SUMMARY

In a first aspect, an IGBT die structure includes an IGBT that has a novel charge carrier injection/extraction structure. The IGBT die structure includes an N+ type buffer layer that is disposed on a P++ type substrate layer. An N− type drift layer is disposed on the N+ type buffer layer. The N+ type buffer layer and the N− type drift layer are epitaxial layers, whereas the P++ type substrate is of monocrystalline substrate material. The upper surface of N− type drift layer is a substantially planar upper surface of semiconductor material. A P type body region extends down into the N− type drift layer from this substantially planar upper semiconductor surface. An N+ type source region extends down into P type body region. A gate is separated from the planar upper semiconductor surface by a thin gate insulation layer. An emitter terminal is coupled to the N+ type source region and to the P type body region. A gate terminal is coupled to the gate. A collector terminal on the bottom side of the IGBT die structure is coupled to the P++ type substrate layer.

In addition to these structures is the novel "charge carrier injection/extraction structure". The charge carrier injection/extraction structure in one example is an auxiliary P type well region and a charge carrier injection/extraction terminal. The auxiliary P type well region extends down into the N− type drift layer from the substantially planar upper semiconductor surface much like the P type body region of the IGBT does, but the auxiliary P type well region has no N+ type source region. The auxiliary P type well region is separated from the P type body region by an amount of the N− type drift layer. The auxiliary P type well region is also separated from the underlying P++ type substrate layer by another amount of the N− type drift layer. The charge carrier injection/extraction terminal is a metal terminal like the other terminals of the IGBT structure, but the charge carrier injection/extraction terminal is coupled to the auxiliary P type well region and is not coupled to any of the other terminals of the IGBT die structure.

In one multi-cell implementation, there may be many unit cells in the IGBT die structure. Each unit cell includes its own auxiliary P type well region. All the auxiliary P type well regions of all the unit cells are coupled together by metal of the charge carrier injection/extraction terminal.

During a turn on time TON of the IGBT, a current $I_A$ can be injected through the charge carrier injection/extraction terminal, through the auxiliary P type well region, and into the N− type drift layer, thereby injecting charge carriers into the N− type drift layer. The injection of these charge carriers accelerates the establishment of electron/hole gas in the N− type drift layer and thereby reduces IGBT turn on time.

During a turn off time TOFF of the IGBT, a current $I_A$ can be extracted from the auxiliary P type well region and out of the IGBT die structure via the charge carrier injection/extraction terminal. The extraction of this current from the charge carrier injection/extraction terminal causes charge carriers to be removed from the N− type drift layer. The removal of these charge carriers accelerates the elimination of the electron/hole gas in the N− type drift layer and thereby reduces IGBT turn off time.

By reducing IGBT turn on time and by reducing IGBT turn off time, associated switching energy losses in a system employing switching IGBTs are reduced. In addition to reducing IGBT turn on time and IGBT turn off time, a current $I_A$ can be injected into the charge carrier injection/extraction terminal throughout the on time of the IGBT. This continuous supply of current into the charge carrier injection/extraction terminal maintains a high density of the electron/hole gas in the N− type drift layer and reduces $V_{CE(SAT)}$ of the IGBT. The reduction in $V_{CE(SAT)}$ during the on time of the IGBT serves to reduce conduction losses.

In a second aspect, an IGBT assembly includes an IGBT die structure and a current injection circuit. In some examples, the IGBT die structure and the current injection circuit are packaged together in a semiconductor device package. In other examples, the IGBT die structure is packaged in a semiconductor device package and the current injection circuit is disposed outside the package. The current injection circuit detects the beginning of a turn on time TON, and in response injects a current $I_A$ into the charge carrier injection/extraction terminal of the IGBT die structure during the turn on time TON. The injection of the current $I_A$ reduces the duration of the turn on time TON. In addition, the current injection circuit may detect the beginning of a turn off time TOFF, and in response may extract a current $I_A$ from the charge carrier injection/extraction terminal of the IGBT die structure. The extraction of the current $I_A$ reduces the duration of the turn off time TOFF.

There are many ways of realizing the current injection circuit of the IGBT assembly. In one example, the current injection circuit is a current transformer. The current transformer may involve a first bond wire and a second bond wire that are magnetically coupled together. The current transformer may involve a small surface mount transformer. A first winding of the small surface mount transformer is wound in clockwise fashion around a core. A second winding of the surface mount transformer is wound in counter-clockwise fashion around the core. The small surface mount transformer in some cases is mounted directly onto the emitter terminal of the IGBT die within a semiconductor device package. When an emitter current begins to flow through a first winding of the current transformer at the beginning of a turn on time of the IGBT, the transformer causes an $I_A$ current to flow in the second winding and into the charge carrier injection/extraction terminal of the IGBT die structure. Likewise, when the emitter current begins to drop at the beginning of a turn off time of the IGBT, the transformer causes a current $I_A$ to be drawn from the charge carrier injection/extraction terminal of the IGBT die structure and into the second winding of the transformer.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 7 is a cross-sectional diagram that illustrates how injection of a current into the IGBT die structure of FIG. 6 reduces IGBT turn on time.

FIG. 8 is a cross-sectional diagram that illustrates how extraction of a current out of the IGBT die structure of FIG. 6 reduces IGBT turn off time.

FIGS. 9A-14A and 9B-14B are diagrams of various steps in a method of manufacturing an Atomic-Lattice-Layer (A-L-L) unit cell of an IGBT die structure, where the IGBT die structure has a charge carrier injection/extraction terminal.

DETAILED DESCRIPTION

Reference will now be made in detail to background examples and some embodiments of the invention, examples of which are illustrated in the accompanying drawings. In the description and claims below, when a first object is referred to as being disposed "over" or "on" a second object, it is to be understood that the first object can be directly on the second object, or an intervening object may be present between the first and second objects. Similarly, terms such as "upper", "top", "up", "down", "bottom", and "backside" are used herein to describe relative orientations between different parts of the structure being described, and it is to be understood that the overall structure being described can actually be oriented in any way in three-dimensional space. The notations N+, N−, N, P++, P+, and P are only relative, and are to be considered in context, and do not denote any particular dopant concentration range. A region denoted generally in the claims to be "P type", however, is being indicated to be P type doped, and may be lightly doped, moderately doped, or heavily doped with P type dopants. Similarly, a region denoted in the claims to be N type is being indicated to be N type doped, and may be lightly doped, moderately doped, or heavily doped with N type dopants.

Figure 1:
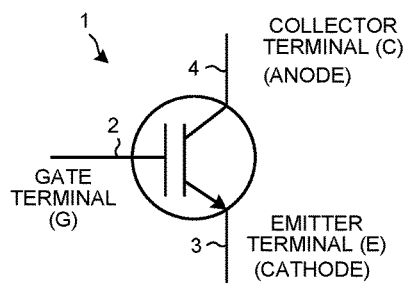
FIG. 1 (Prior Art) is a symbol of a prior art N-channel enhancement type Insulated Gate Bipolar Transistor (IGBT).
Figure 2:
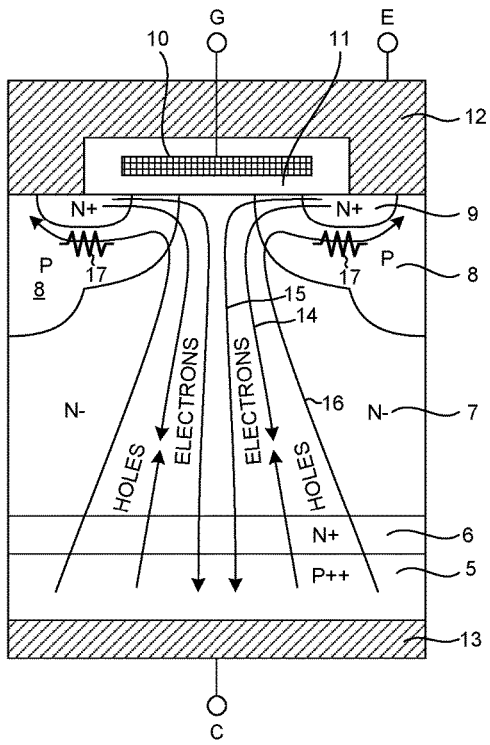
FIG. 2 (Prior Art) is a simplified cross-sectional diagram of a prior art IGBT.
Figure 3:
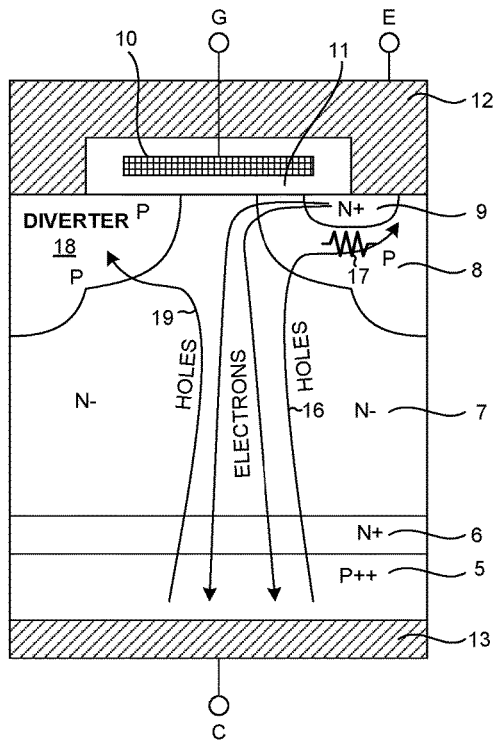
FIG. 3 (Prior Art) is a simplified cross-sectional diagram of an old IGBT structure involving a diverter that was sometimes employed in the past to prevent latchup.
Figure 4:
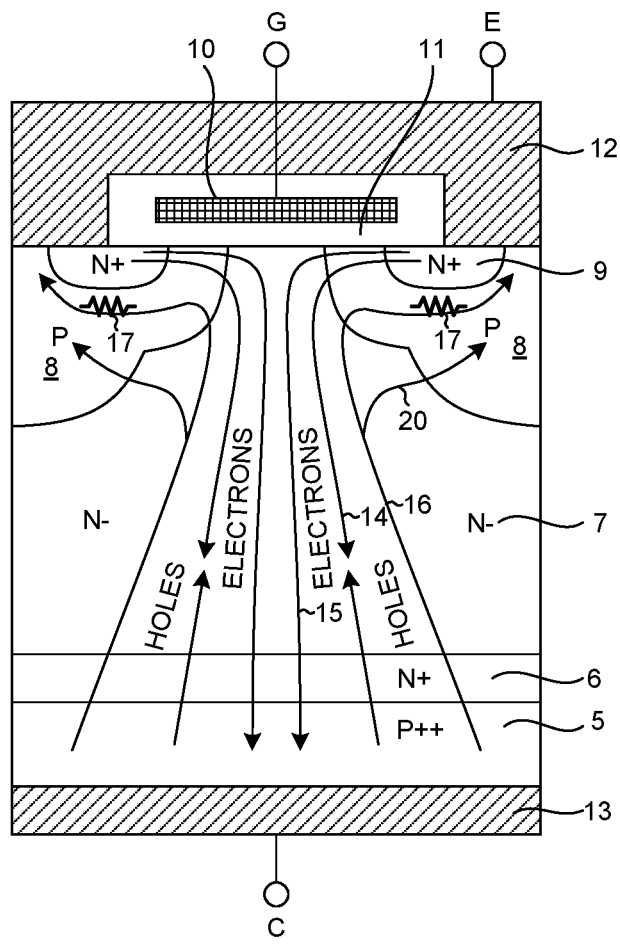
FIG. 4 is a diagram of a more contemporary IGBT design that is not susceptible to latchup.
Figure 5:
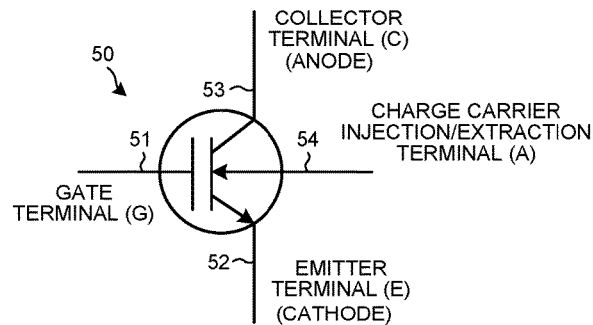
FIG. 5 is a symbol of a novel IGBT die structure that has a charge carrier injection/extraction terminal.

FIG. 5 is a symbol 50 of an N-channel enhancement type Insulated Gate Bipolar Transistor (IGBT) that has a "charge carrier injection/extraction terminal" in accordance with one novel aspect. IGBT symbol 50 has a gate terminal (G) 51, an emitter terminal (E) 52, a collector terminal (C) 53, and a charge carrier injection/extraction terminal (A) 54. The charge carrier injection/extraction terminal is also referred to in this patent document as the "auxiliary terminal" (A) 54 or the "auxiliary P type well terminal" (A) 54.

Figure 6:
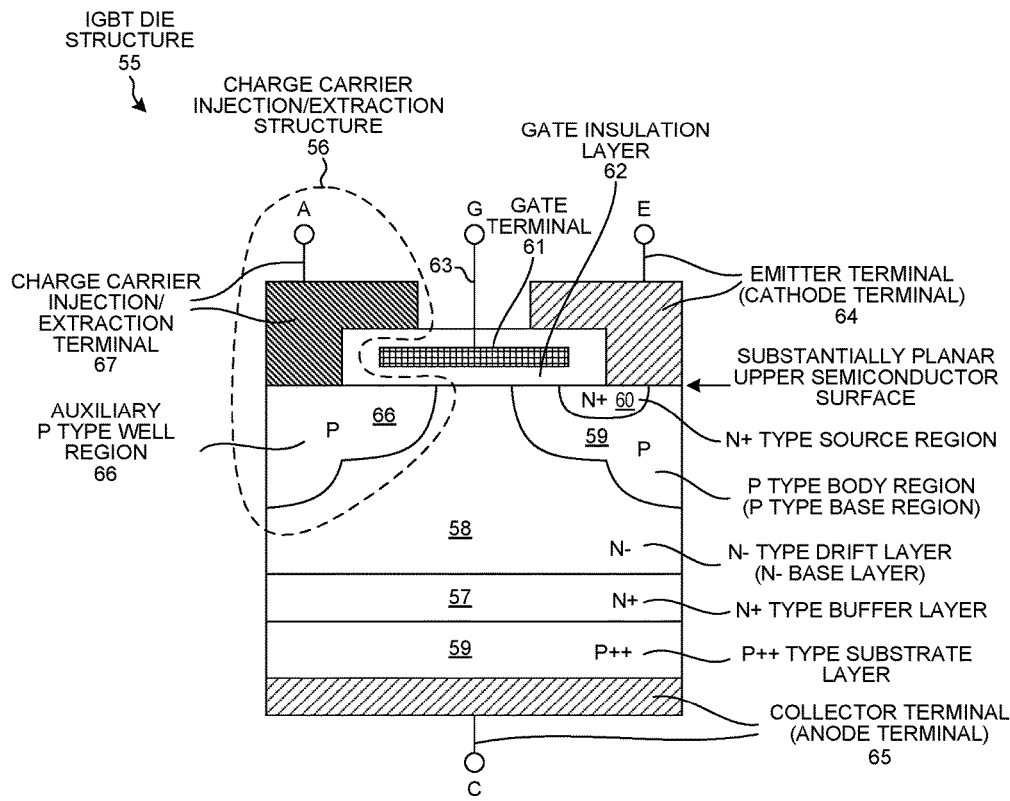
FIG. 6 is a cross-sectional diagram of a novel IGBT die structure that includes a charge carrier injection/extraction structure.

FIG. 6 is a cross-sectional diagram of an IGBT die structure 55. IGBT die structure 55 includes a vertical IGBT that has a novel charge carrier injection/extraction structure 56. Epitaxial layers 57 and 58 are grown on a P++ type semiconductor substrate layer 59. Epitaxial N+ type buffer layer 57 is disposed on the P++ type substrate layer 59. Epitaxial N− type drift layer 58 is disposed on the N+ type buffer layer 57. The upper surface of N− type drift layer 58 is a substantially planar upper surface of semiconductor material. A P type body region 59 extends down into the N− type drift layer 58 from this substantially planar upper semiconductor surface. An N+ type source region 60 extends down into P body region 59 from the substantially planar upper semiconductor surface. A gate 61, such as a gate of polysilicon material, is separated from the planar upper semiconductor surface by a thin gate insulation layer 62. Reference number 63 represents a gate metal terminal (G) (not shown) that allows connection to the gate 61. An emitter metal terminal (E) 64 straps each P type body region 59 to its corresponding N+ type source region 60 as shown. A collector metal terminal (C) 65 is disposed on the bottom side of P++ type substrate layer 59. Charge carrier injection/extraction structure 56 includes an auxiliary P type well region 66 and a charge carrier injection/extraction metal terminal (A) 67. As mentioned above, the charge carrier injection/extraction terminal 67 is also referred to as the auxiliary terminal of the device. Auxiliary P type well region 66 extends down into the N− type drift layer 58 from the substantially planar upper semiconductor surface.

Charge carrier injection/extraction terminal 67 is a separate metal terminal that is not electrically connected to emitter terminal 64, nor is it connected to any other terminal of the IGBT die structure. The voltage between emitter terminal 64 and terminal 67 on the auxiliary P type well region 66 is not clamped by any diode as in a diode diverter structure. There is no N+ region extending down into the auxiliary P type well region 66 from the upper surface of the semiconductor material. The auxiliary P type well region is not a floating P well that is not connected to other terminals of the IGBT, but rather the auxiliary P type well region is connected to charge carrier injection/extraction terminal 67 as shown in FIG. 6.

A simplified explanation of device operation is set forth below. During turn on of the IGBT, electrons flow from N+ type source region 60, leftward through a thin conductive channel region under the gate and laterally across the P type body region 59, to the portion of the N− type drift layer 58 under gate 61, and then downward through N− type drift layer 58, and downward through N+ type buffer layer 57. This current flow passes through P++ type substrate layer 59 and to collector terminal 65. The flow of electrons into the N− type drift layer 58 causes an increase in electron density in the N− type drift layer 58. This increase in electron density causes the potential of the N− type drift layer 58 to decrease, thereby forward biasing the PN junction between the P++ type substrate layer 59 and the N+ type buffer layer 57. The forward biasing of this junction causes holes to be emitted from P++ emitter layer 59 into N+ buffer layer 57. Some of the holes recombine with electrons in the N− type drift layer 58, but others of the injected holes pass upward through the N− type drift layer 58, into the P type body region 59, under N+ type source region 60, and to the emitter terminal 64. Due to the injection of holes, the concentration of holes in the N-type drift layer 58 increases. This increase in hole concentration in turn draws more electrons from the N+ type source region 60, through the conductive channel, and into the N− type drift layer 58. The holes are drawn in in order to neutralize charge (create charge neutrality) in the N− type drift layer 58. With holes being injected into the N-type drift layer 58 from the P++ type substrate layer 59, and with electrons being drawn into the N− type drift layer 58 from the N+ type source region 60 to create charge neutrality, a high density electron/hole "gas" is established in the N− type drift layer 58. The amount of time required for the IGBT to turn on is limited by the time required to establish this electron/hole gas.

FIG. 7 illustrates a novel aspect of the IGBT die structure 55 and its operation. To reduce the turn on time of the IGBT, a current $I_A$ is injected through the charge carrier injection/extraction terminal 67 during the turn on time of the IGBT. Initially, when the channel is created under the gate 61, electrons flow from the N+ type source region 60, across the channel, and into the N-type drift layer 58. The electrons that do not recombine with holes in the N− type drift layer 58 pass downward to the collector as explained above. As a result, holes are injected into the N− type drift layer 58. The holes that do not recombine with electrons in the N− type drift layer 58 pass upward and through the P type body region 59 and to the emitter terminal 64 as described above. In a novel aspect, when this emitter current starts to flow, a proportional auxiliary current $I_A$ is made to flow into the auxiliary terminal 67. As a result, holes are injected from the auxiliary P type well region 66 and into the adjacent region 68 of the N− type drift layer 58. This serves to increase the hole concentration in this region 68 of the N− type drift layer 58, and therefore reduces the time required for holes from other sources to create the high density of holes of the electron/hole gas that is to be created in the other areas of the N− type drift layer 58. Because the volume of N-type drift layer 58 that must be filled with holes from other sources (such as the P++ substrate layer 59) is decreased, the total time required to achieve the high density of holes of the "gas" throughout the entire N− type drift layer 58 is also reduced.

In addition, the injection of holes into the N-type drift layer 58 due to the $I_A$ current flow causes more electrons to be drawn from the N+ type source region 60 and across the channel region, into the N− type drift layer 58, and into region 68. This increased flow of electrons is to equalize charge (create charge neutrality) in region 68. Charge neutrality is not actually achieved, but the flow of electrons partially equalizes charges in this region. The overall flow of electrons from the N+ type source region 60 into the N− type drift layer 58 is higher than it would be otherwise without the injection of holes into region 68 from auxiliary P type well region 66. Due to the increased flow of electrons from the N+ type source region 60, the overall amount of time required to establish the high electron concentration of the "gas" everywhere in the N− type drift layer 58 is also reduced.

In addition to reducing the turn on time of the IGBT, the injected $I_A$ current also reduces the collector-to-emitter saturation voltage $V_{CE(SAT)}$ during the IGBT's static on time. The extra holes and electrons flowing into the N-type drift layer 58 as a result of the auxiliary terminal 67 cause a higher density of electrons and a higher density of holes to exist in the N− type drift layer 58 than would otherwise exist were there no auxiliary P type well region 66. The higher densities of holes and electrons manifest themselves as a lower resistance between the collector and emitter when the IGBT is on. In operation of the IGBT, this lower collector-to-emitter resistance results in a correspondingly lower $V_{CE(SAT)}$.

In order to turn off the IGBT, the flow of electrons from the N+ type source region 60 is stopped under control of the gate due to the channel region being removed. The gate-to-emitter voltage $V_{GE}$ may, for example, be dropped from 15 volts to zero volts so that the channel is removed. With no conductive channel through which electrons can flow, the flow of electrons from emitter terminal 64 is turned off fairly rapidly. The injection of holes from the P++ type substrate layer 59 is also suspended fairly rapidly due to the potential of the N− type drift layer rising and reverse biasing the P++ substrate to N+ type buffer junction. But even without holes and electrons flowing into the N− type drift layer 58, there still remain holes and electrons of the high density gas that are now trapped in the N− type drift layer 58. These trapped electrons and holes must either recombine or be removed for the IGBT to be off. In a conventional IGBT structure, a substantial "tail" of current continues to flow through the IGBT as the IGBT turns off due to the removal of the one of these trapped charges that do not recombine. Time is required for the high density of holes and electrons in the N− type drift layer 58 to recombine, or for the electrons and holes to otherwise escape from the N− type drift layer 58, before the high density electron/hole "gas" is gone and the IGBT is off.

FIG. 8 illustrates a novel aspect of the IGBT structure and operation. To reduce the turn off time of the IGBT, a current $I_A$ is extracted through the charge carrier injection/extraction terminal 67 during the turn off time of the IGBT. Due to the $I_A$ current being extracted, holes are drawn from region 69 and into the auxiliary P type well region 66. Rather than having to wait for recombination or other mechanisms to reduce hole concentration in this region 69, the hole concentration is reduced by the current $I_A$ being withdrawn from the auxiliary terminal 67. Reducing the concentration of holes in region 69 by use of the auxiliary terminal 67 reduces the number of holes that have to be removed from the other parts of the N− type drift layer 58 by recombination or by flow through the P type body region 59 to the emitter terminal. As a result, the amount of time for the high density of holes of the "gas" to be removed from the entire N− type drift layer 58 is reduced.

In addition, the flow of holes out of region 69 through the auxiliary terminal 67 causes a depletion region and corresponding electric field at the auxiliary P type well region 66 to N− type drift layer 58 boundary. This electric field serves to sweep electrons away from the boundary and deeper into the N− type drift layer 58. The flow of these electrons that are pushed away from the boundary is illustrated with arrows 70. Rather than having to wait for the high density of electrons to be removed from region 69 by recombination or by other mechanisms, the electrons in region 69 are pushed out by the electric field as a result of the current $I_A$. Reducing the concentration of electrons in region 69 in this way reduces the number of electrons of the gas that have to be removed from the other parts of the N– type drift layer 58 by recombination or by flow out of the collector. As a result, the total time required to remove the high density electron/holes gas from the N– type drift layer 58 is reduced as compared to what that time would be were there to be no auxiliary P type well region 66.

During a normal operation of the IGBT, the IGBT is turned on during a turn on time, then the IGBT is operated in the forward conduction mode for a period of time, then the IGBT is turned off during a turn off time, and then the IGBT is operated in the forward block mode. This cycle typically repeats, over and over. During the turn on time, an auxiliary current $I_A$ is injected into the auxiliary terminal 67 thereby reducing turn on time. During forward conduction mode operation, the current $I_A$ is also injected into the auxiliary terminal 67 to reduce $V_{CE(SAT)}$. During the turn off time, an auxiliary current $I_A$ is drawn out of the auxiliary terminal 67 in order to reduce turn off time. Reducing turn on time, reducing turn off time, and reducing $V_{CE(SAT)}$ in this way reduces conduction losses in the IGBT.

FIGS. 9A-14A and 9B-14B are diagrams of various steps in the manufacture of an Atomic-Lattice-Layer (A-L-L) unit cell 108 of an IGBT die.

Figure 9A:
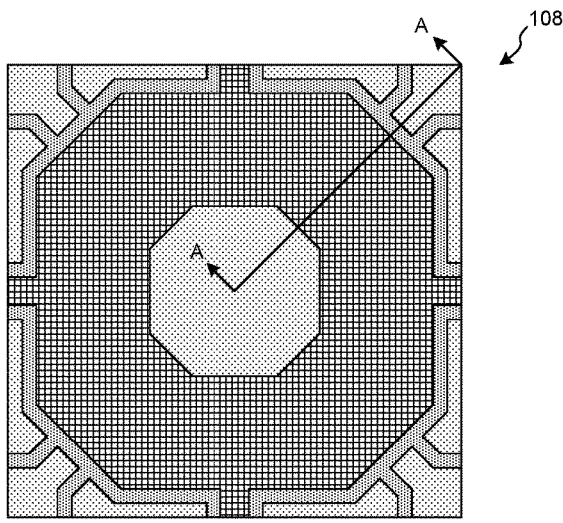
Figure 9B:
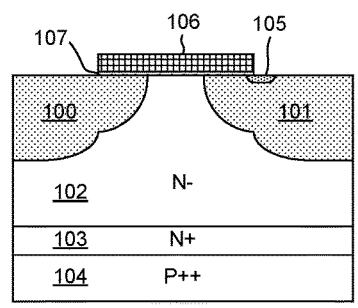

FIG. 9A is a top-down diagram of unit cell 108. Unit cell 108 is a square when viewed from this perspective. FIG. 9B is a cross-sectional view taken along line A-A in FIG. 9A. There is a centrally located auxiliary P type well region 100 surrounded by a P type body region 101. The auxiliary P type well region 100 and the P type body region 101 extend down into an N– type drift layer 102. N-type drift layer 102 is disposed on an N+ type buffer layer 103. Layers 102 and 103 are epitaxial layers that are disposed on a P++ type substrate layer 104. Extending into the P type body region 101 from the upper surface of the semiconductor material is an N+ type source region 105. A polysilicon gate 106 is separated from the underlying semiconductor material by a thin gate insulating layer 107.

Figure 10A:
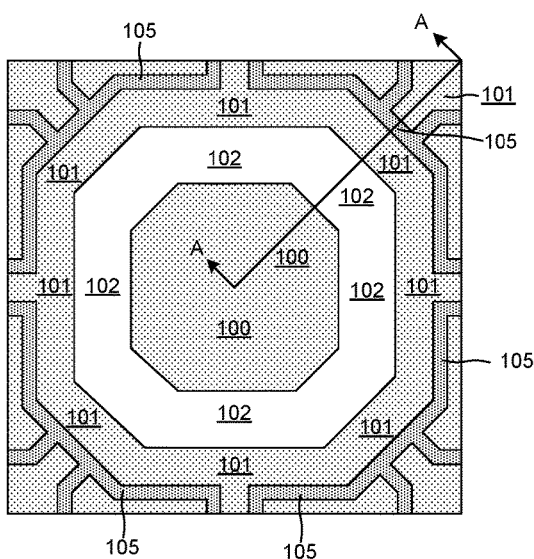
Figure 10B:
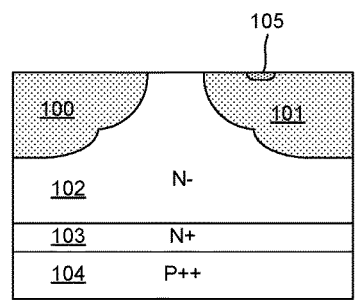

FIG. 10A is a top-down diagram of the unit cell 108 after the step of forming the polysilicon gate has been completed, but in the diagram of FIG. 10A the polysilicon layer is not shown so that the boundaries of the auxiliary P type well region 100 and the boundaries of the P type body region 101 will be evident. FIG. 10B is a cross-sectional view taken along line A-A in FIG. 10A.

Figure 11A:
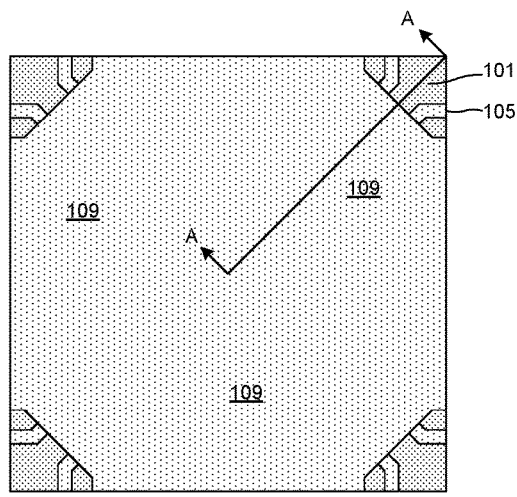
Figure 11B:
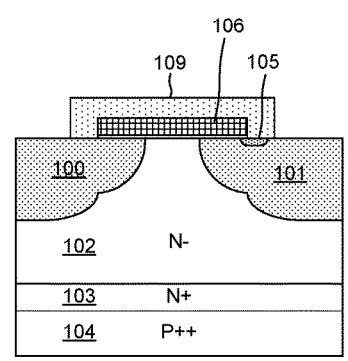

FIG. 11A is a top-down diagram of unit cell 108 after the step of depositing and patterning a layer of oxide insulation 109 over the gate 106. FIG. 11B is a cross-sectional view taken along line A-A in FIG. 11A.

Figure 12A:
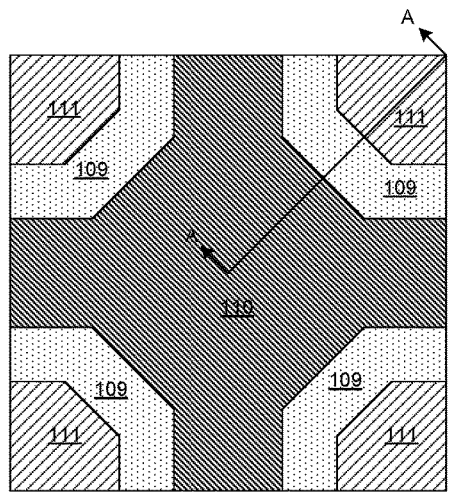
Figure 12B:
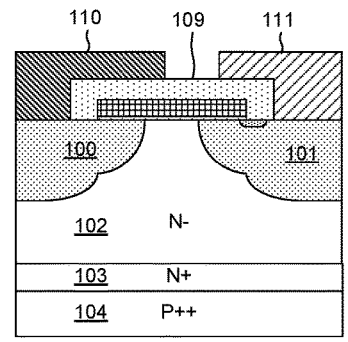

FIG. 12A is a top-down diagram of the unit cell 108 after the step of depositing and patterning a first metal layer into a feature 110 of the auxiliary terminal (metal that extends down to the auxiliary P type well region 100) and a feature 111 of an emitter terminal (metal that extends down to the N+ type source region 105 and P– type body region 101). FIG. 12B is a cross-sectional view taken along line A-A in FIG. 12A.

Figure 13A:
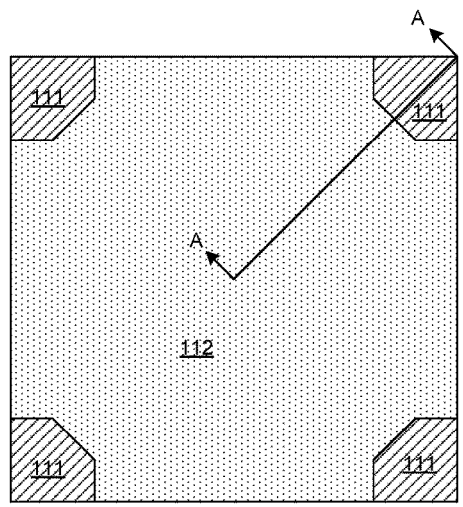
Figure 13B:
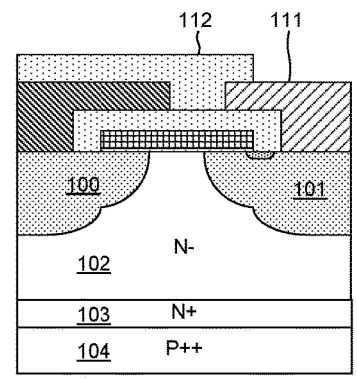

FIG. 13A is a top-down diagram of the unit cell 108 after the step of depositing and forming a second layer of insulation 112. FIG. 13B is a cross-sectional view taken along line A-A in FIG. 13A.

Figure 14A:
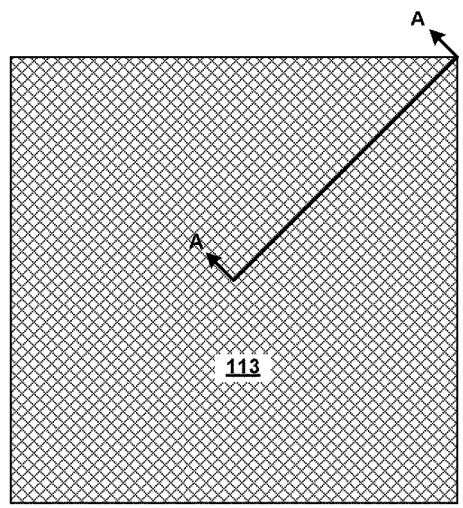
Figure 14B:
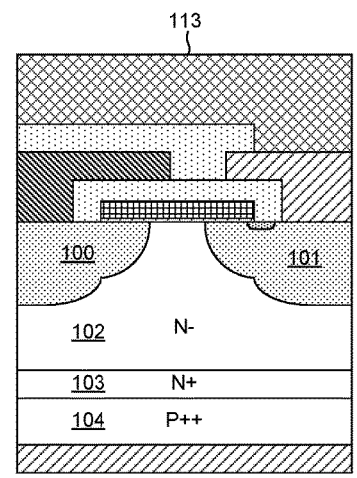

FIG. 14A is a top-down diagram of the unit cell 108 after the step of depositing and forming a second metal layer into a second feature 113 of the emitter terminal.

Figure 15:
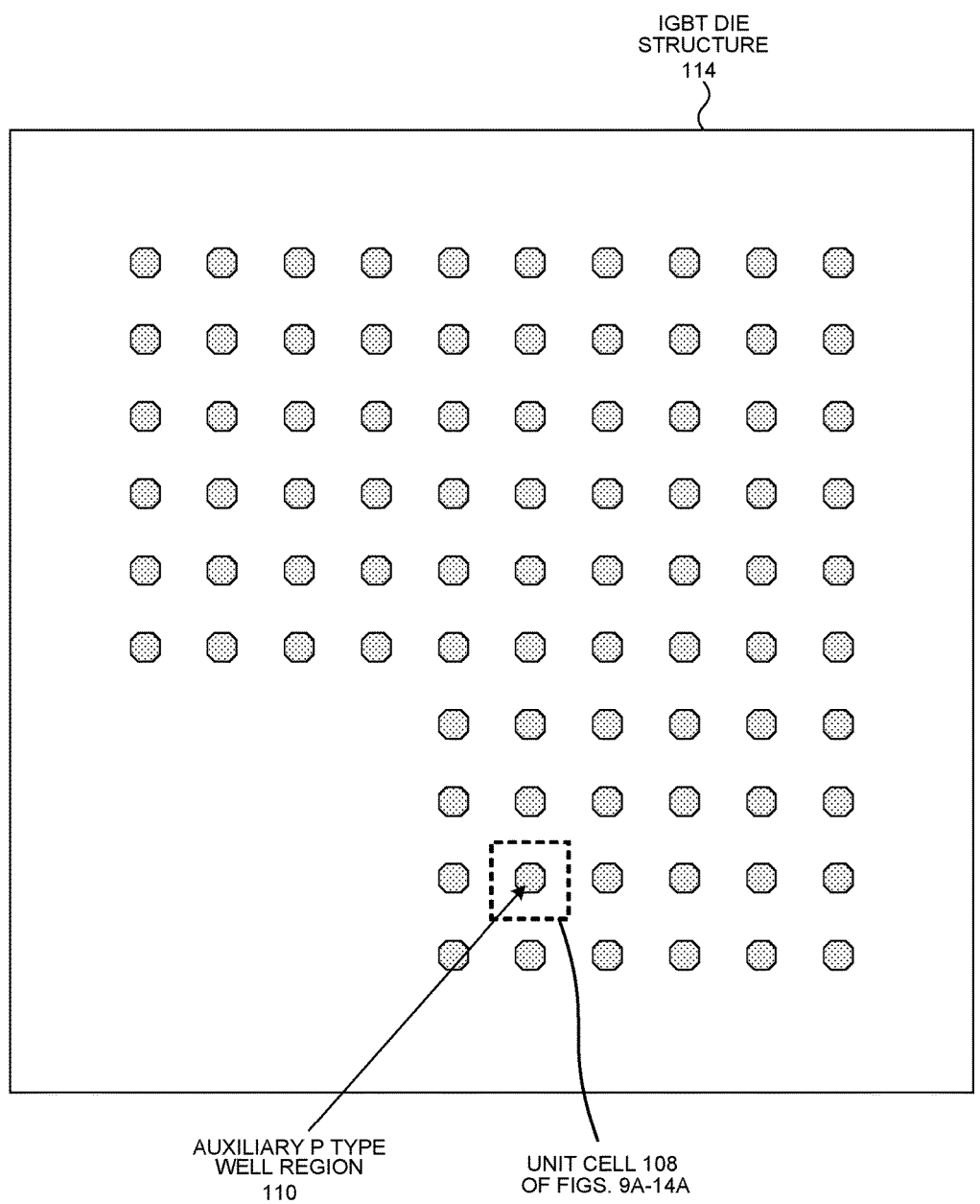
FIG. 15 is a top-down diagram of an IGBT die structure of which the unit cell 108 is a part. The diagram shows a two-dimensional array of auxiliary P type well regions.

FIG. 15 is a top-down diagram of an IGBT die 114 of which the unit cell 108 is a part. The locations of the auxiliary P type well regions are shown in FIG. 15. The auxiliary P type well regions are arranged in a two-dimensional array of rows and columns as shown.

Figure 16:
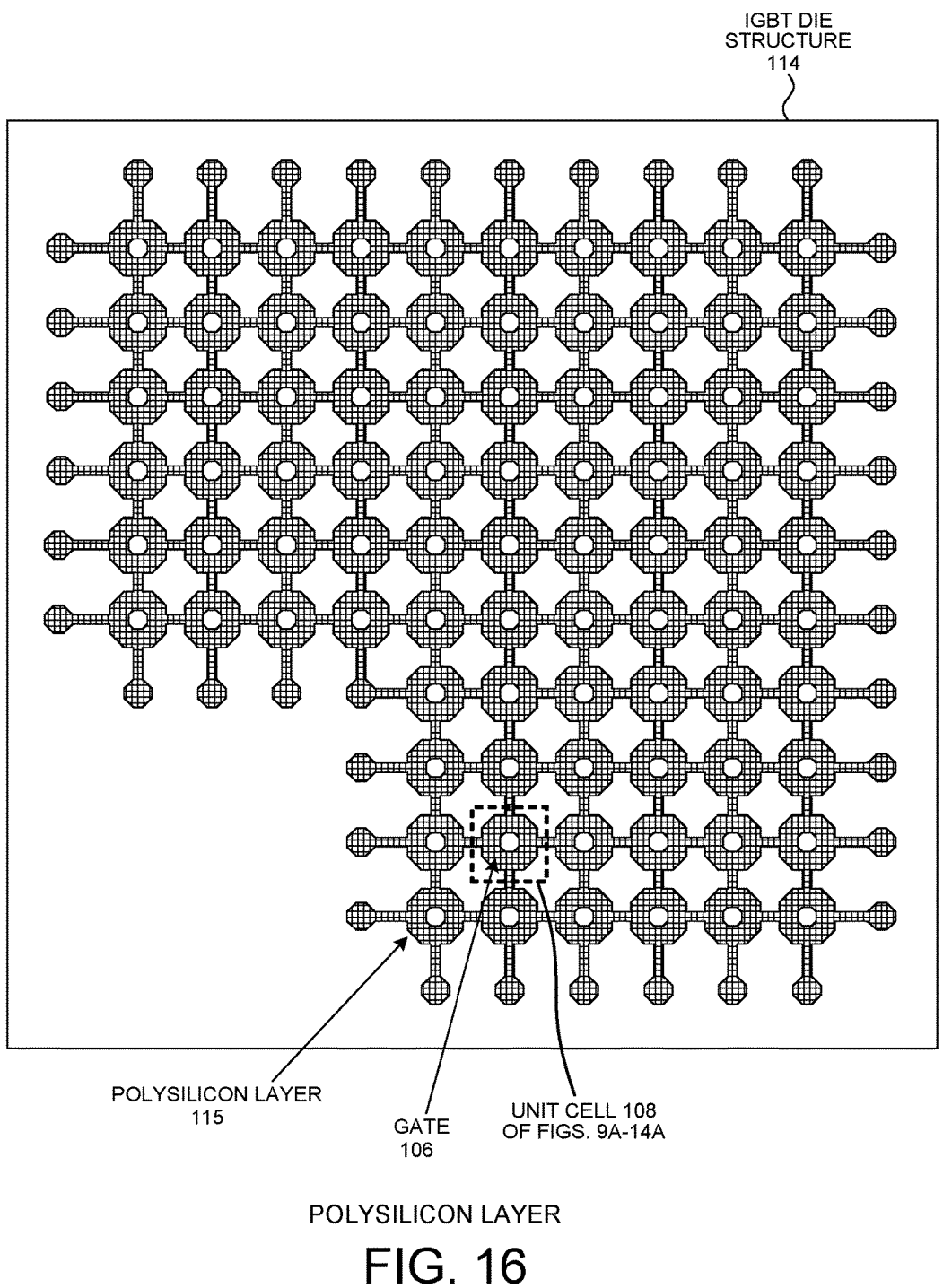
FIG. 16 is a top-down diagram of the IGBT die structure of FIG. 15, except that the polysilicon layer that makes up the polysilicon gates of the IGBTs is shown.

FIG. 16 is a top-down diagram of IGBT die 114 showing the polysilicon layer 115 that makes up the polysilicon gates of the IGBTs of the structure, including the polysilicon gate 106 of unit cell 108.

Figure 17:
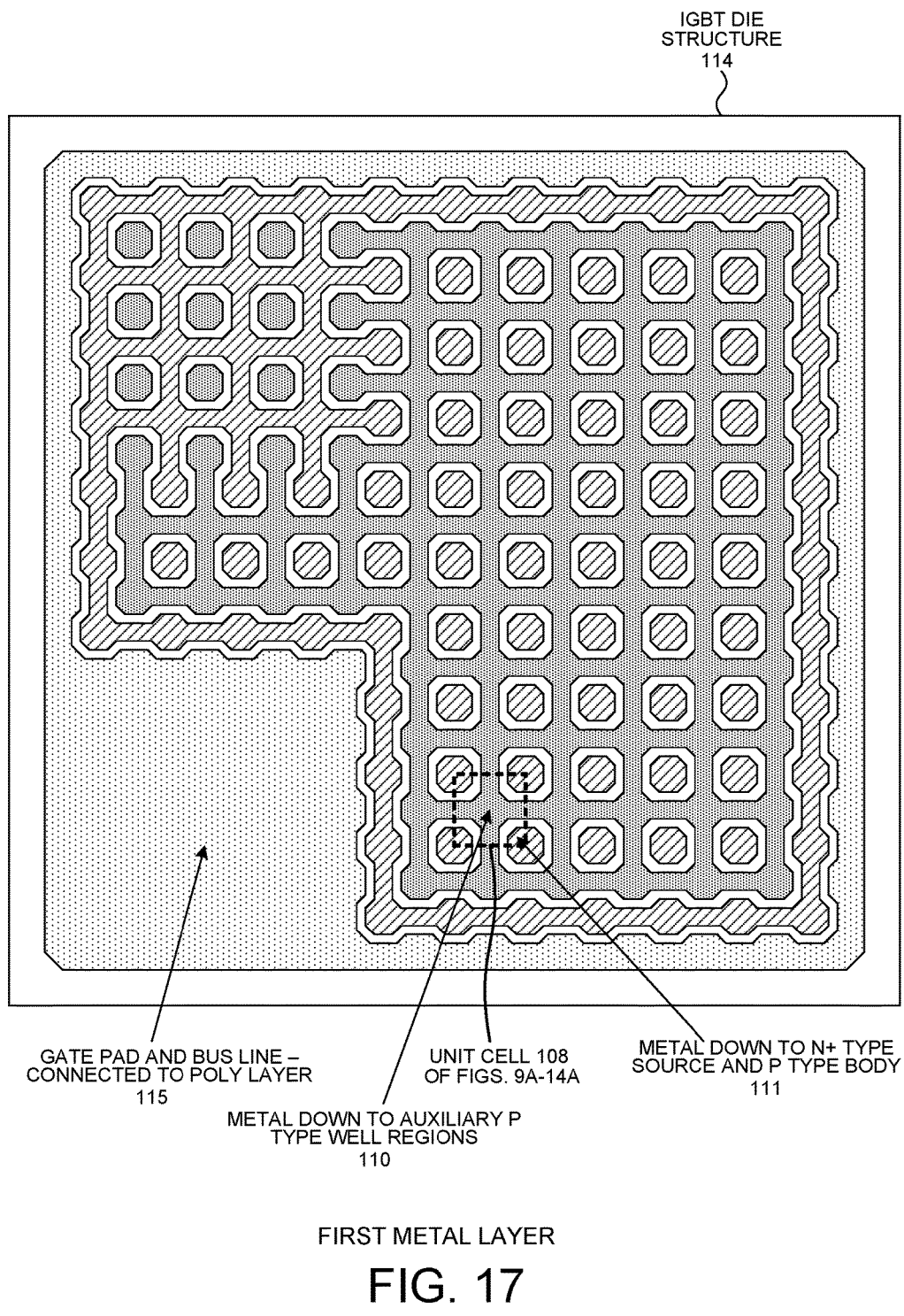
FIG. 17 is a top-down diagram of the IGBT die structure of FIG. 15, except that the first metal layer (after deposition and patterning) is shown.

FIG. 17 is a top-down diagram of IGBT die 114 showing the first metal layer after deposition and patterning. The first metal layer forms metal 110 (that extends down to the auxiliary P type well regions) and metal 111 (that extends down to the N+ type source regions and the P type body regions). The first metal layer also forms the gate pad and bus line 115.

Figure 18:
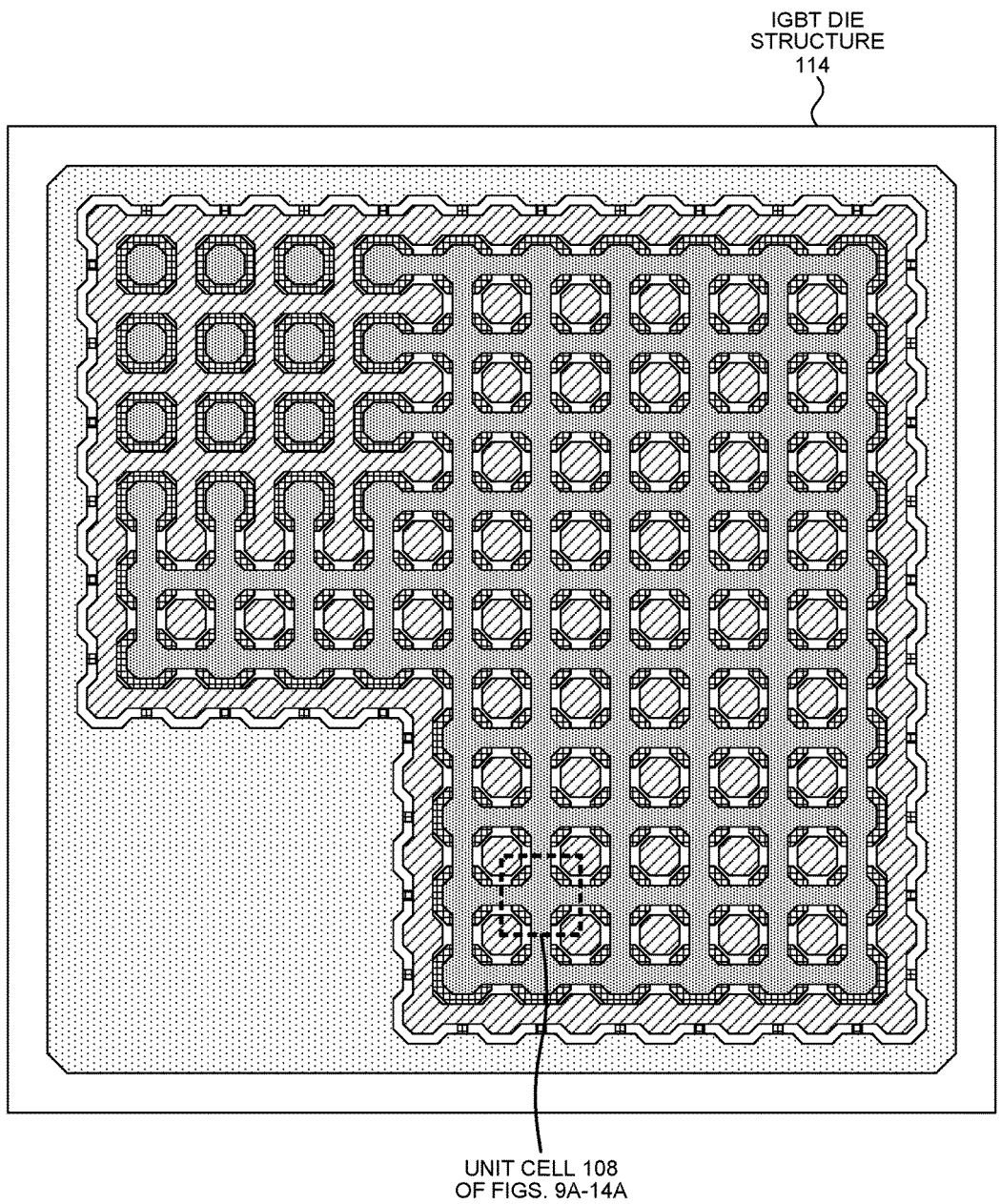
FIG. 18 is a top-down diagram of the IGBT die structure of FIG. 15, showing the first metal layer (after deposition and patterning), and also showing exposed portions of the underlying polysilicon.

FIG. 18 is a top-down diagram of IGBT die 114 showing the polysilicon layer underneath the patterned first metal layer.

Figure 19:
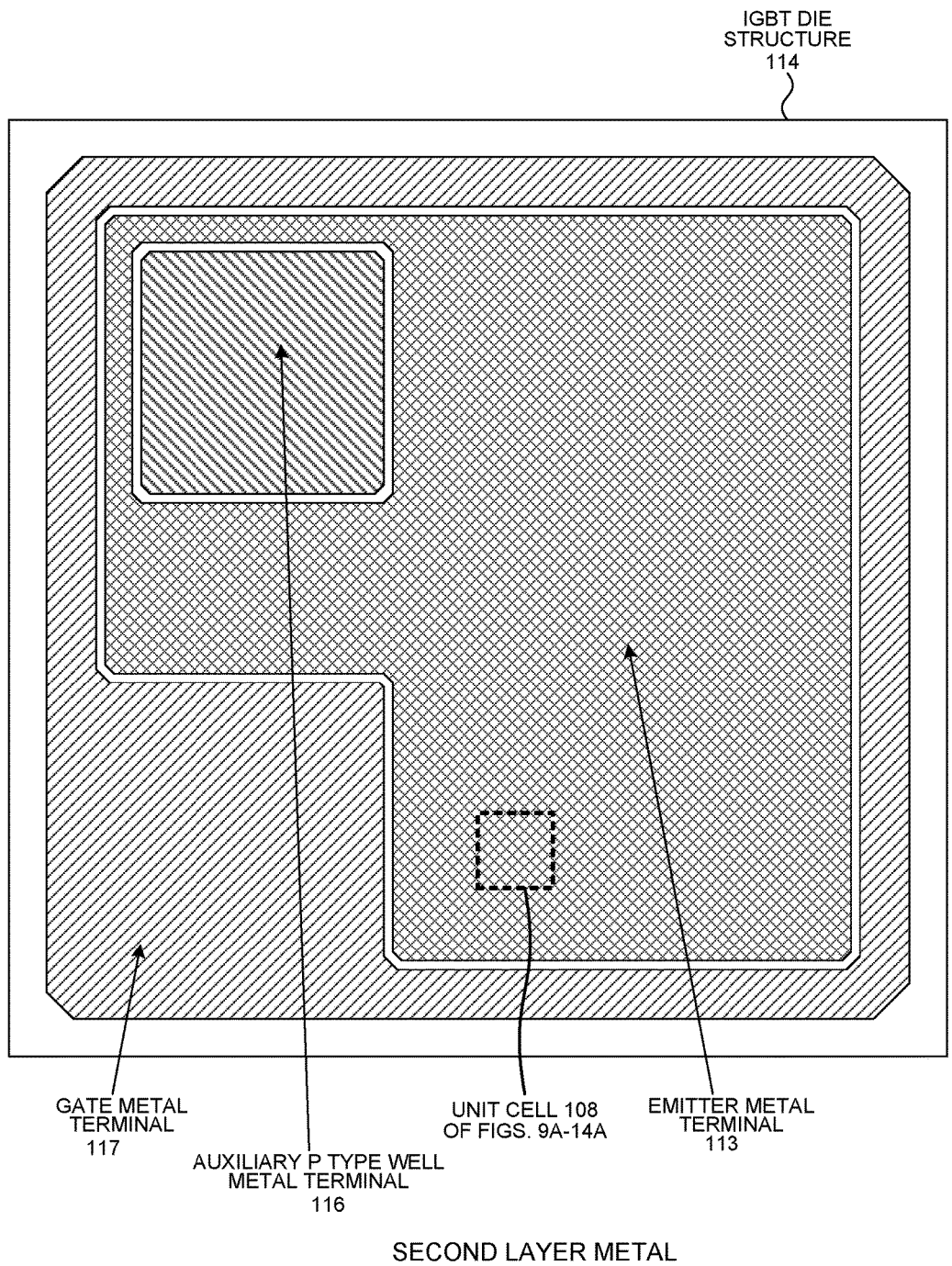
FIG. 19 is a top-down diagram of the IGBT die structure of FIG. 15, showing the second metal layer (after deposition and patterning).

FIG. 19 is a top-down diagram of IGBT die 114 showing the second metal layer. The second metal layer is deposited and patterned to form a feature 113 of the emitter terminal, a feature 116 of the auxiliary P well terminal, and a feature 117 of the gate terminal. Metal features 113, 116 and 117 are parts of the upper surface of the die (ignoring any overlying passivation layers).

Figure 20:
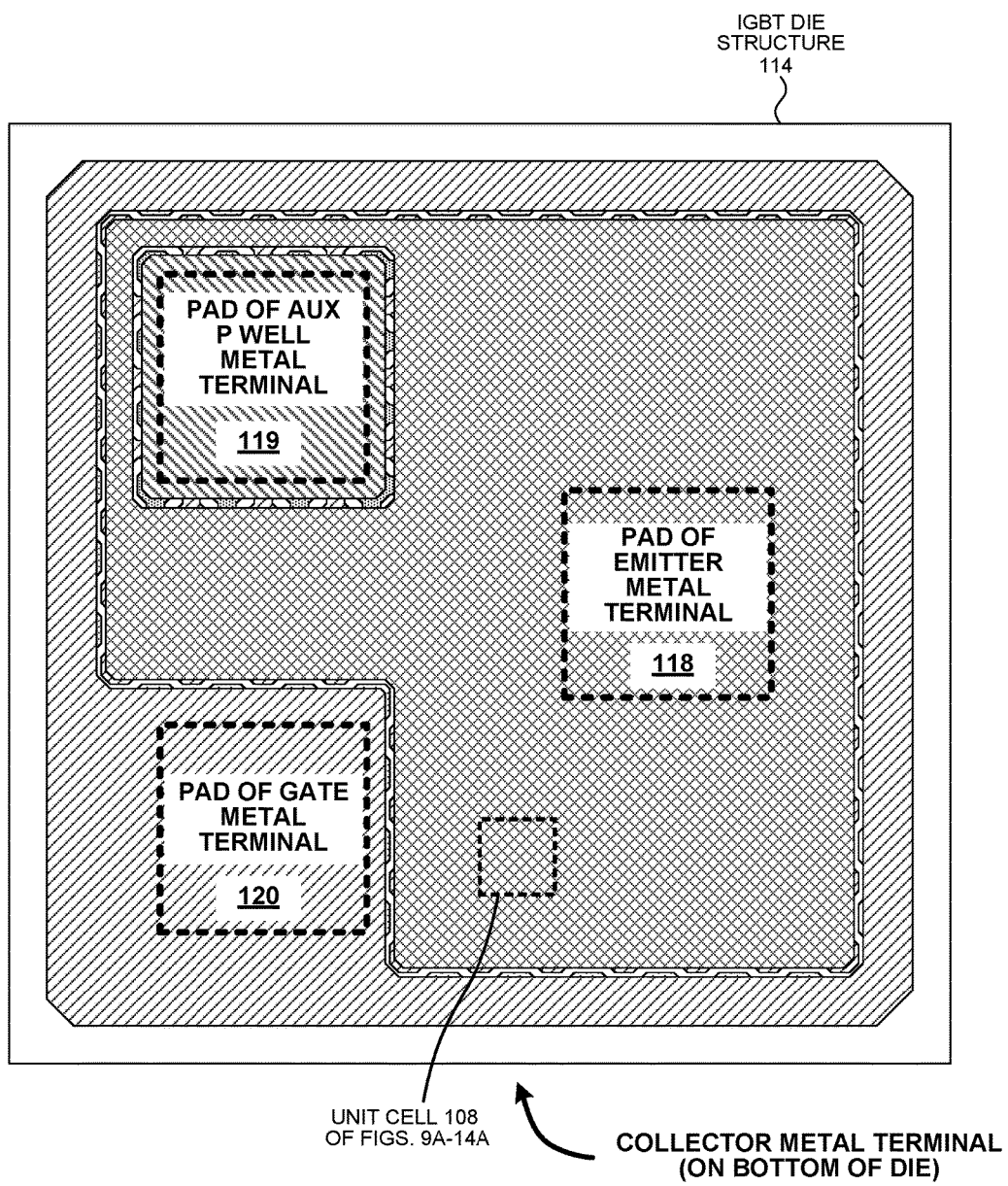
FIG. 20 is a top-down diagram of the IGBT die structure of FIG. 15, showing the pad portions 118-120 of the three metal terminals on the upper surface of the IGBT die structure.

FIG. 20 is a top-down diagram of IGBT die 114 showing the pad portion 118 of the emitter metal terminal, the pad portion 119 of the auxiliary P type well metal terminal, and the pad portion 120 of the gate metal terminal. Pads 118-120 are disposed on the upper surface of the die. The backside of the die is covered in metal as well, and that backside metal is the collector metal terminal (not shown) of the IGBT.

Figures 21, 22:
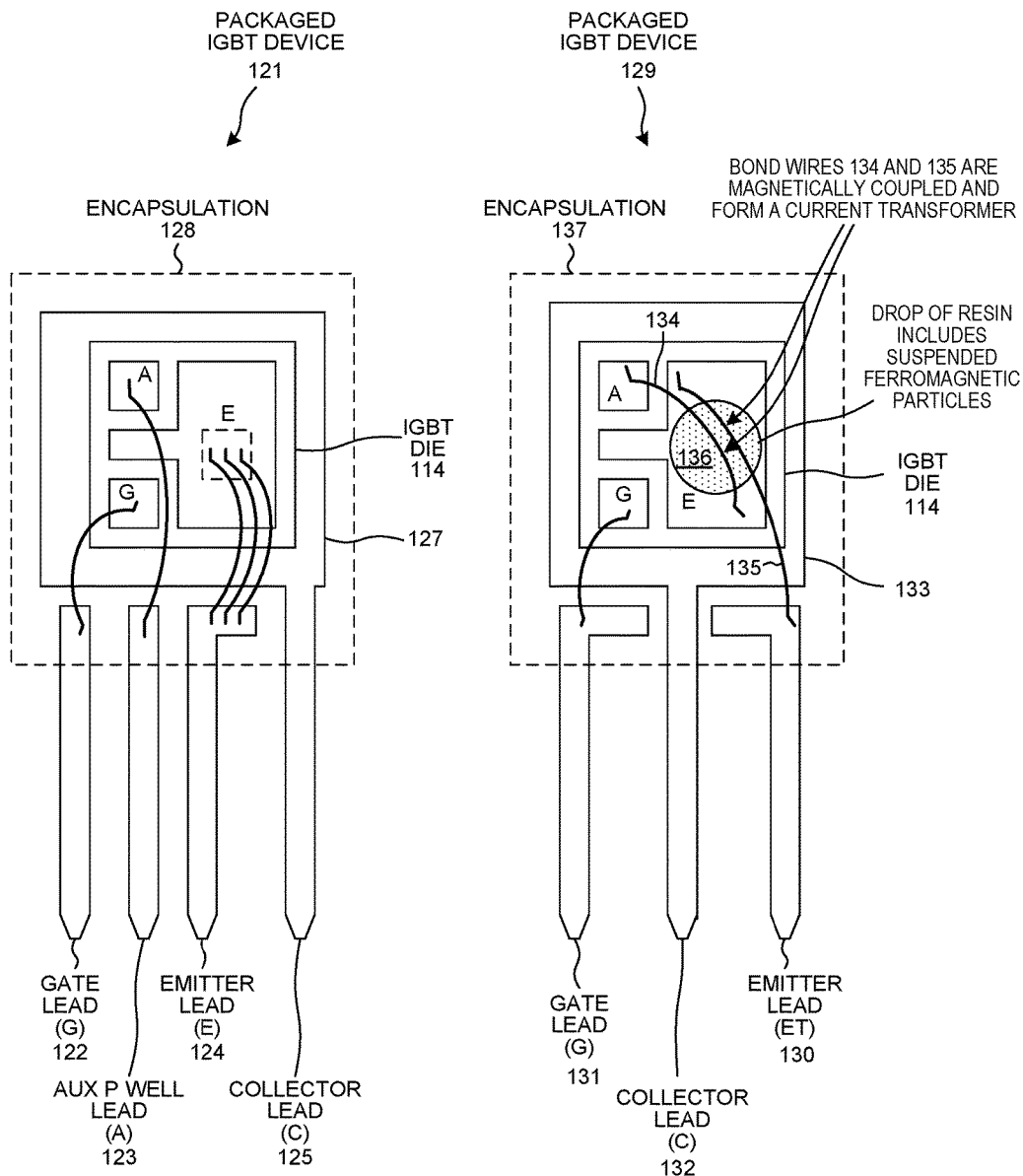
FIG. 21 is a diagram of a four-terminal packaged IGBT device in accordance with one novel aspect.
FIG. 22 is a diagram of the three-terminal packaged IGBT device in accordance with one novel aspect, where the three-terminal packaged IGBT device has a current transformer.

FIG. 21 is a diagram of a four-terminal packaged IGBT device 121 in accordance with one novel aspect. Packaged IGBT device 121 has a gate lead or terminal 122, an auxiliary P type well lead or terminal 123, an emitter lead or terminal 124, and a collector lead or terminal 125. The IGBT die 114 is of the same construction as shown and explained above in connection with the prior diagrams. The collector metal on the backside of IGBT die 114 is mounted to the die attach slug 127 from which the collector lead 125 extends. The gate pad, the auxiliary P well pad, and the emitter pad are connected their respective leads 122, 123 and 124 by corresponding bond wires as shown. Dashed line 128 represents an amount of encapsulant such as an injection molded epoxy resin encapsulant.

FIG. 22 is a diagram of a three-terminal packaged IGBT device 129 in accordance with another novel aspect. Packaged IGBT device 129 has an emitter transformer lead or terminal (ET) 130, a gate lead or terminal (G) 131, and a collector lead or terminal (C) 132. The IGBT die 114 is of the same construction as shown and explained above in connection with the prior diagrams except that the auxiliary P well pad, the gate pad, and the emitter pad on the IGBT upper surface are arranged differently. The collector metal on the backside of IGBT die 114 is mounted to the die attach slug 133 from which the collector lead 132 extends. The gate pad G is connected by a bond wire to gate lead 131 as shown. The auxiliary P type well pad A is connected by a bond wire 134 to a distant part of the emitter terminal metal, and the emitter transformer lead (ET) 130 is connected by a bond wire 135 to a distant part of the emitter terminal metal E, so that the two wires 134 and 135 extend past each other in parallel fashion as shown. A drop 136 of resin that includes suspended particles of a magnetic material such as ferromagnetic particles is disposed on the emitter metal. The bond wires 134 and 135 extend through this drop 136 as shown. The drop 136 functions to increase the magnetic coupling between bond wires 134 and 135. Bond wires 134 and 135 together with drop 136 form a current transformer. Dashed line 137 represents an amount encapsulant such as an amount of injection molded epoxy resin encapsulant.

Figure 23:
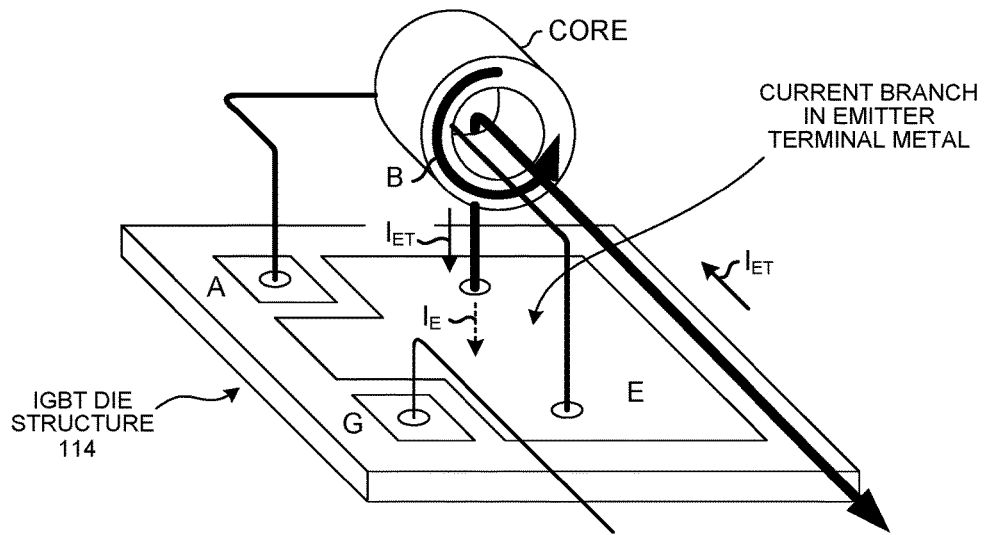
FIGS. 23 and 24 illustrate operation of the current transformer of FIG. 22.
Figure 24:
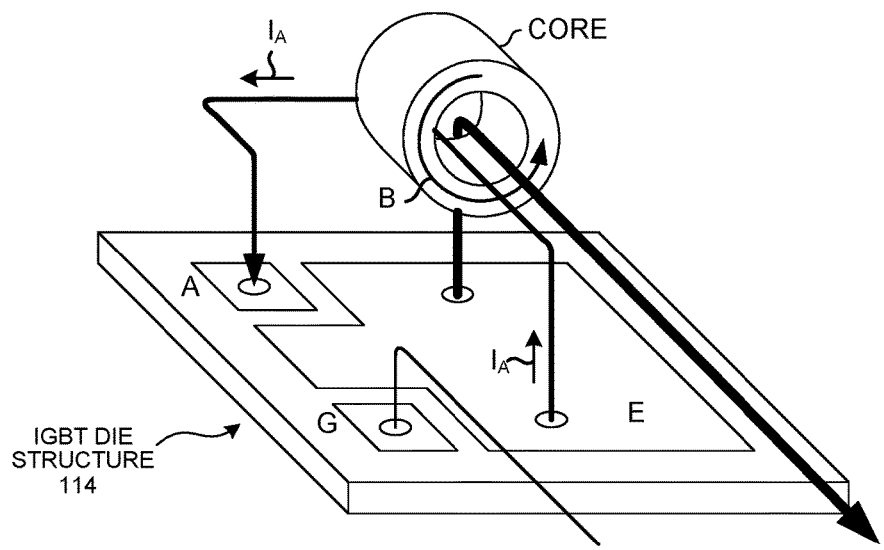

FIGS. 23 and 24 illustrate operation of the current transformer of FIG. 22. As shown in FIG. 23, when an emitter transformer current $I_{ET}$ starts to flow out of the emitter pad of the IGBT die, the emitter transformer current $I_{ET}$ passes through bond wire 135 on its way to emitter transformer lead (ET) 130 of the package. This current flow $I_{ET}$ causes energy to be stored in the magnetic core. The magnetic core in this case involves the drop 136 of ferromagnetic particles. The bond wire 135 is, however, magnetically coupled to bond wire 134. Accordingly, as shown in FIG. 24, the magnetic coupling causes an auxiliary current $I_A$ to flow from the emitter pad, through the transformer, and into the auxiliary pad A of the IGBT die. As a result of the conduction of the auxiliary current $I_A$, the magnetic core is left with less flux and stores less energy. Due to operation of this current transformer, the increase in emitter current $I_E$ during the turn on time of the IGBT causes an auxiliary current $I_A$ to be injected into the auxiliary P type well terminal A of the IGBT, and this injection of current reduces IGBT turn on time as explained above. Similarly, due to operation of this current transformer, the decrease in emitter current $I_E$ during the turn off time of the IGBT causes an auxiliary current $I_A$ to be extracted out of the auxiliary P type well terminal of the IGBT, and this extraction of current reduces IGBT turn off time as explained above. The actual emitter current IE flow from the emitter terminal metal and into the semiconductor material of the IGBT die structure. There is a current branch in the emitter terminal metal of the device in that the $I_{ET}$ current comes into the emitter metal terminal, and currents $I_E$ and $I_A$ come out of the current branch.

Figure 25:
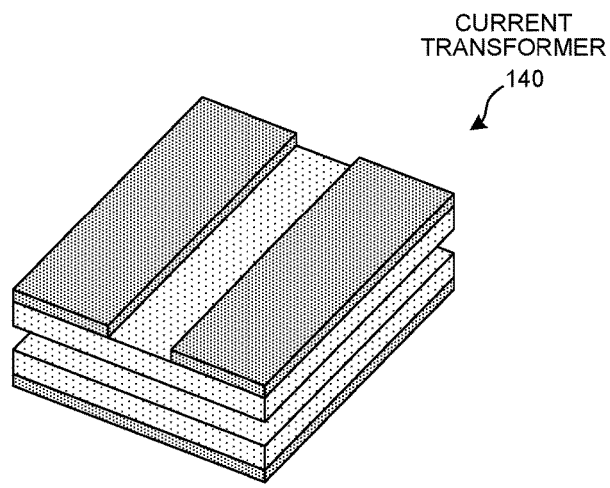
FIG. 25 is a perspective diagram of a surface mount current transformer.

FIG. 25 is a perspective diagram of another embodiment of a current transformer 140 usable to inject $I_A$ current into, and to extract $I_A$ current out of, the auxiliary P type well terminal of an IGBT.

Figure 26:
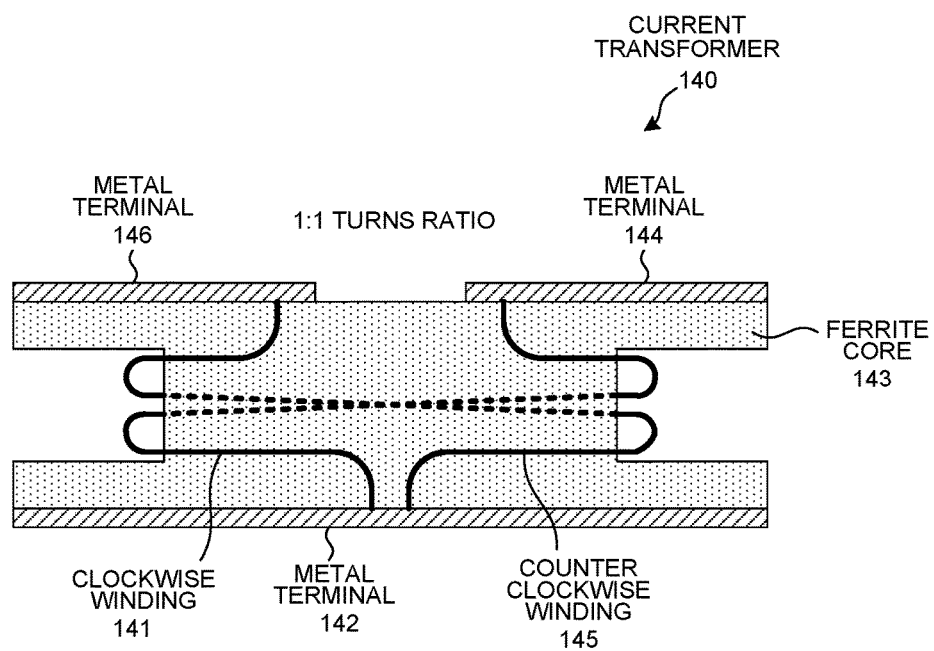
FIG. 26 is a cross-sectional view of the surface mount current transformer of FIG. 25.

FIG. 26 is a cross-sectional diagram of the current transformer 140 of FIG. 25. A first winding 141 extends from metal terminal 142, is wound around the ferrite core 143 in clockwise fashion, and terminates at metal terminal 144. A second winding 145 extends from metal terminal 142, is wound around the ferrite core 143 in counter-clockwise fashion, and terminates at metal terminal 146. The turns ratio of transformer 140 is 1:1.

Figure 27:
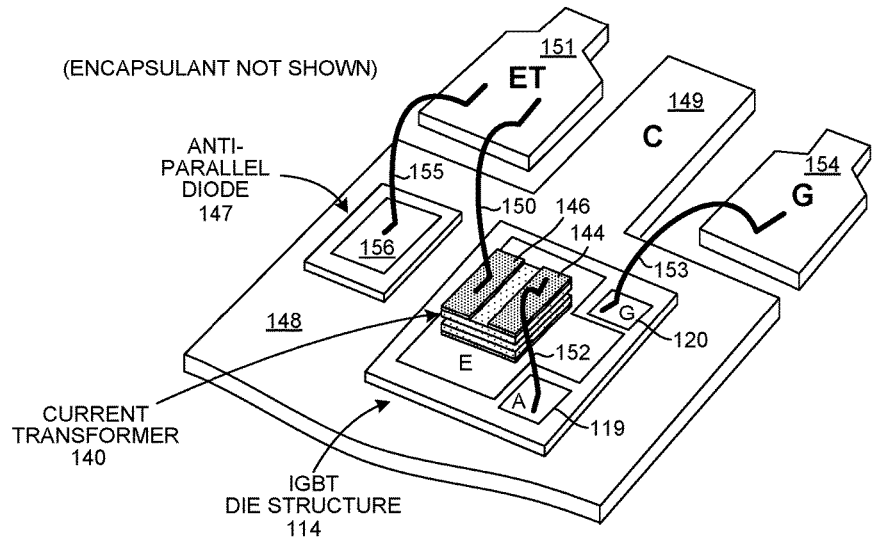
FIG. 27 is a perspective diagram that shows the contents of a packaged IGBT device. The contents include the surface mount current transformer of FIGS. 25 and 26 mounted on the emitter terminal of an IGBT die structure.

FIG. 27 is a perspective diagram of a use of the current transformer 140 in combination with IGBT die 114 and an anti-parallel diode 147. The IGBT die 114 is of the same construction as shown and explained above in connection with the prior diagrams. The collector metal (not shown) on the backside of the IGBT die 114 is surface-mounted to the die attach slug 148 from which the collector lead (C) 149 extends. The metal terminal 142 on the bottom side of the current transformer 140 is surface-mount connected to the upper surface of the emitter metal pad on the upper surface of IGBT die 114. An emitter current flowing out of the emitter pad of the IGBT die 114 passes up through the metal terminal 142 of the current transformer 140, through the clockwise winding 141, through metal terminal 144, through a bond wire 150, and to the emitter transformer lead (ET) 151 of the package. This flow of $I_{ET}$ current causes an auxiliary P well current $I_A$ to flow from the metal terminal 142 of the current transformer 140, through counter-clockwise winding 145, through metal terminal 146, through a bond wire 152, and into the auxiliary P type well pad (A) 119 of IGBT die 114. The gate pad (G) 120 of IGBT die 114 is connected by a bond wire 153 to the gate lead (G) 154 of the package. A bond wire 155 connects the emitter transformer lead (ET) 151 to the anode wire bond pad 156 of anti-parallel diode 147. The cathode electrode (not shown) on the backside of the anti-parallel diode 147 is surface mounted to the die attach slug 148 and therefore is also connected to the collector (not shown) on the backside of the IGBT die 114. The entire assembly is encapsulated in an amount of an encapsulant such as an injection molded epoxy resin encapsulant 157.

Figure 28:
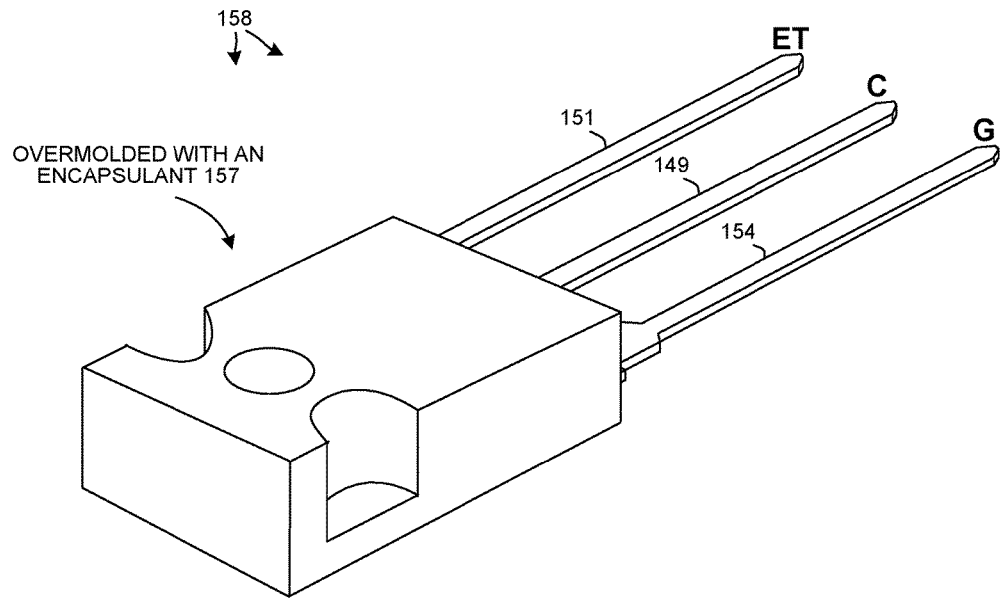
FIG. 28 is a perspective diagram of the packaged IGBT device of FIG. 27.

FIG. 28 is a perspective view of the three-terminal packaged device of FIG. 27. The amount of encapsulant 157 overmolds the components illustrated in FIG. 27.

Figure 29:
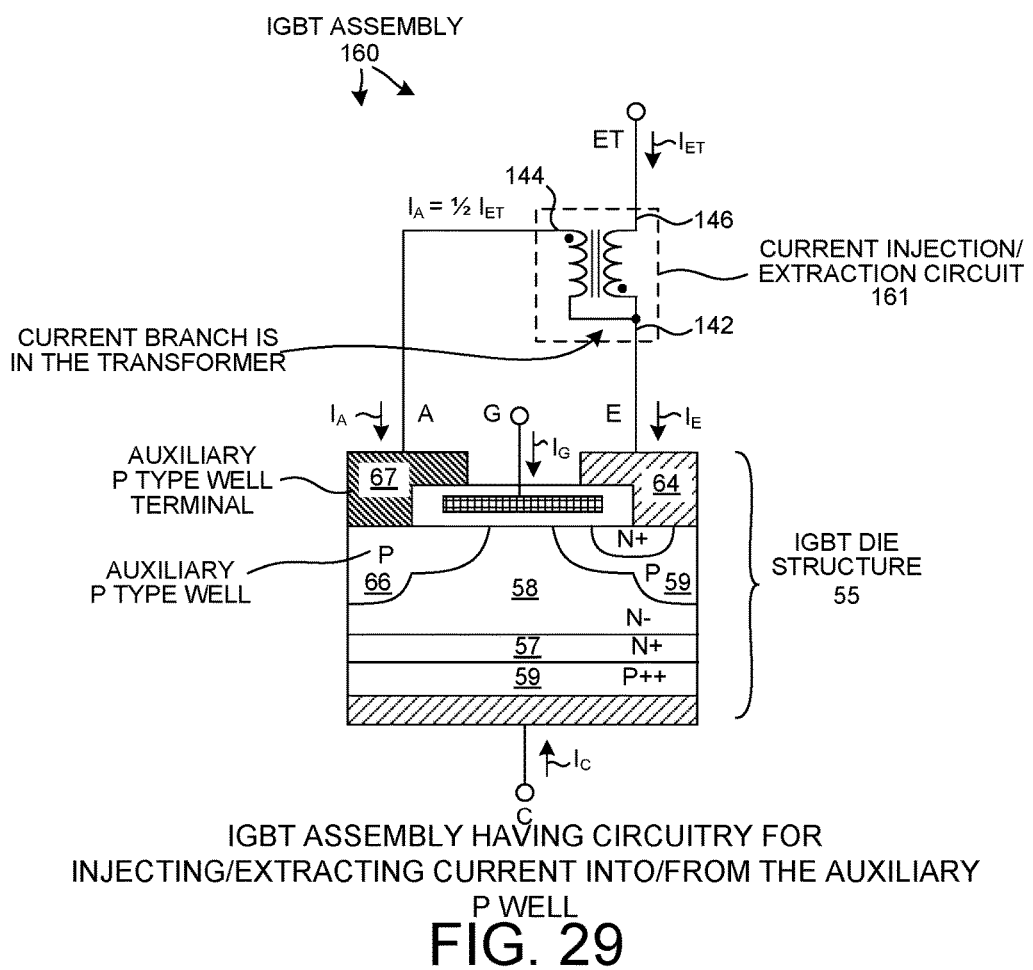
FIG. 29 is a diagram of an IGBT assembly in accordance with one novel aspect.

FIG. 29 is a schematic diagram of an IGBT assembly 160 having circuitry for injection/extracting current into/from an auxiliary P well. IGBT assembly 160 includes IGBT die 114 and a current injection/extraction circuit 161. There are many suitable ways of making the current injection/extraction circuit 161. The function of the current injection/extraction circuit 161 is to inject an auxiliary current $I_A$ into the auxiliary P type well terminal 67 of the IGBT die structure 55 during a turn on time TON of the IGBT, and to extract an auxiliary current $I_A$ out of the auxiliary P type well terminal 67 of the IGBT die structure 55 during a turn off time TOFF of the IGBT. For example, circuit 161 may detect $V_{GE}$ starting to transition high, and after a small delay may inject a current $I_A$ into the auxiliary P type well terminal 67. Circuit 161 may detect $V_{GE}$ starting to transition low, and after a small delay may extract a current $I_A$ from the auxiliary P type well terminal 67. In addition, circuit 161 may supply a current $I_A$ into the auxiliary P type well terminal 67 in a static way throughout times when the IGBT is on and conductive.

In one example, circuit 161 is realized as the current transformer of FIGS. 25 and 26. In another example, circuit 161 is realized as the bondwire/resin drop current transformer structure of FIG. 22. In cases where circuit 161 is a transformer, the IGBT may be used as a switch and the switching frequency is set to be high enough that $I_A$ does not decay to zero before the next switching cycle starts again. The circuit 161 need not, however, necessarily involve a current transformer. Rather the circuit 161 may sense the turn on time and the turn off time, and inject or extract $I_A$ current as appropriate using other circuitry so long as the current injection/extraction function is achieved. In some cases, circuit 161 performs only the current injection function to accelerate turn on time. In other cases, circuit 161 performs only the current extraction function to accelerate turn off time. Circuit 161 may be implemented as part of a packaged IGBT device. Alternatively, circuit 161 may be disposed outside the package that houses the IGBT device.

Figure 30:
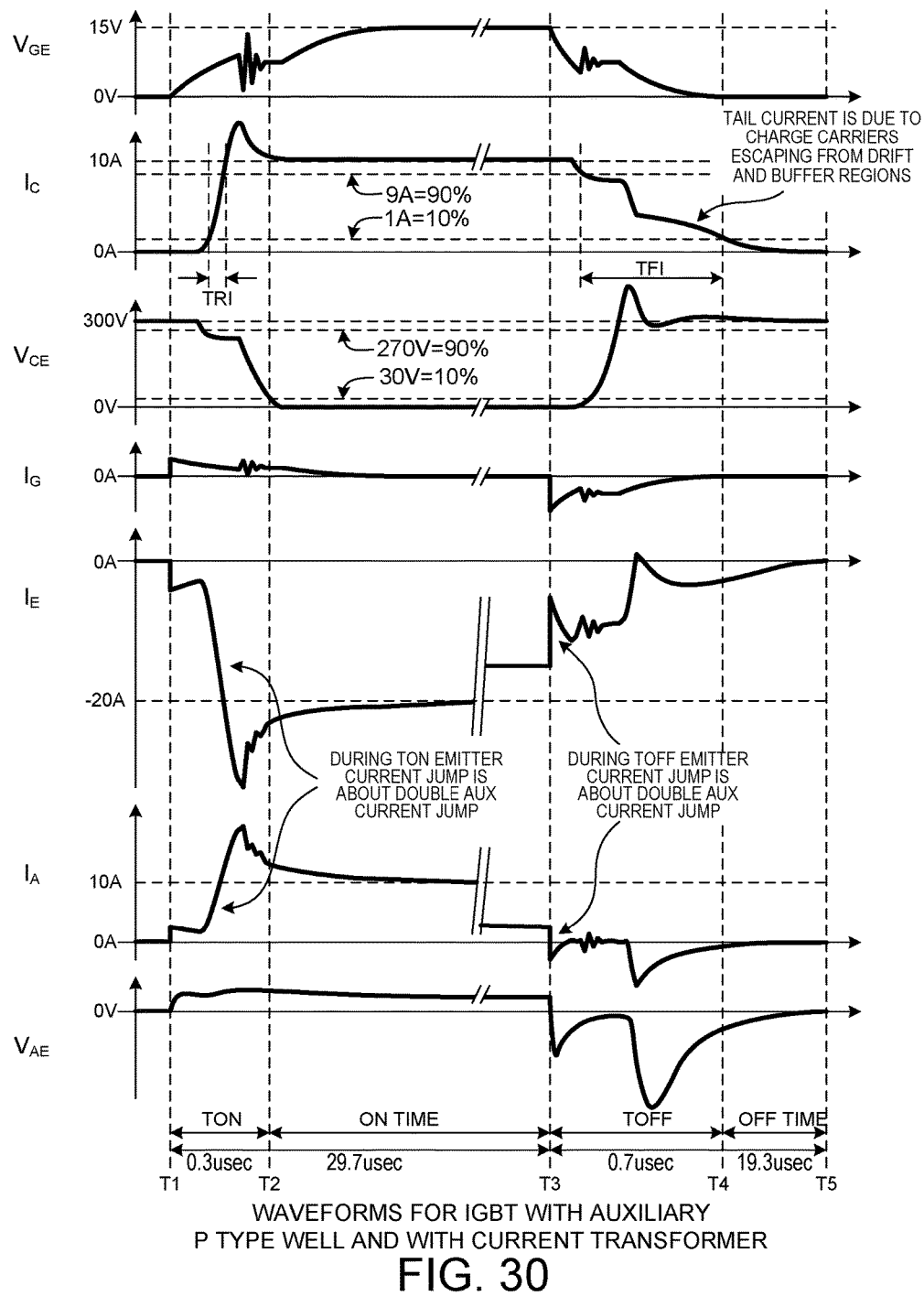
FIG. 30 is a waveform diagram that illustrates an operation of the IGBT assembly of FIG. 29 in use in an application of driving an inductive load.

FIG. 30 is a waveform diagram that illustrates operation of the IGBT die structure 55 and circuit 161 of FIG. 29 in an application of driving an inductive load at 20 kHz with a sixty percent duty cycle. Immediately prior to time T1, the IGBT is off. The collector current $I_C$ is therefore zero and the emitter current $I_E$ is zero. Then at time T1 the IGBT is to be turned on. The voltage on the gate $V_{GE}$ is therefore made to rise. As a result of the conduction mechanisms described above in connection with FIG. 7, the collector and emitter currents rise as shown. Due to operation of the current transformer, the change in emitter current $I_E$ is about double the change in the auxiliary P well current $I_A$ that is injected into the auxiliary P type well terminal. The "turn on time" TON is defined here as the time between the time when the voltage $V_{GE}$ on the gate starts to rise and the time when the collector-to-emitter voltage $V_{CE}$ has dropped to within ten percent of its final value. In the example of FIG. 30, $V_{CE}$ starts at +300 volts at time T1. Its final value is about 2 volts ($V_{CE(SAT)}$). As a result of the IGBT turning on $V_{CE}$ drops to ten percent of +300 volts (+30 volts) by time T2. The time between T1 and T2 is the turn on time TON.

After time T2, the IGBT operates in its forward conduction mode until time T3. At time T3, the IGBT is to be turned off. The voltage $V_{GE}$ on the gate is therefore made to fall, and this causes the IGBT to turn off by the mechanisms described above in connection with FIG. 8. The collector and emitter currents therefore decrease in magnitude. Due to operation of the current transformer, the amount of current $I_A$ extracted from the auxiliary P well terminal is about double the decrease in the emitter current $I_E$. The turn off time TOFF is defined here as the time between the time when the voltage $V_{GE}$ on the gate starts to decrease and the time when the collector current $I_C$ has dropped to within ten percent of its final value. In the example of FIG. 30, $I_C$ starts at ten amperes and its final value is zero amperes. Time T4 is the time when the collector current $I_C$ has dropped to one ampere. The turn off time TOFF is therefore the time between times T3 and T4.

After time T4, the IGBT operates in its forward blocking mode and is off. The IGBT stays off until time T5, when the cycle repeats and $V_{GE}$ is increased to turn on the IGBT once more. The size of the current transformer and the frequency of switching are such that the auxiliary current $I_A$ does not drop below zero volts at any time between T1 and T3 when the IGBT is to be on. If $I_A$ were allowed to drop below zero volts during this time, then the auxiliary P type well region would function like a diverter and the $V_{CE(SAT)}$ of the IGBT would be increased in an undesirable manner leading to increased conduction losses.

Figure 31:
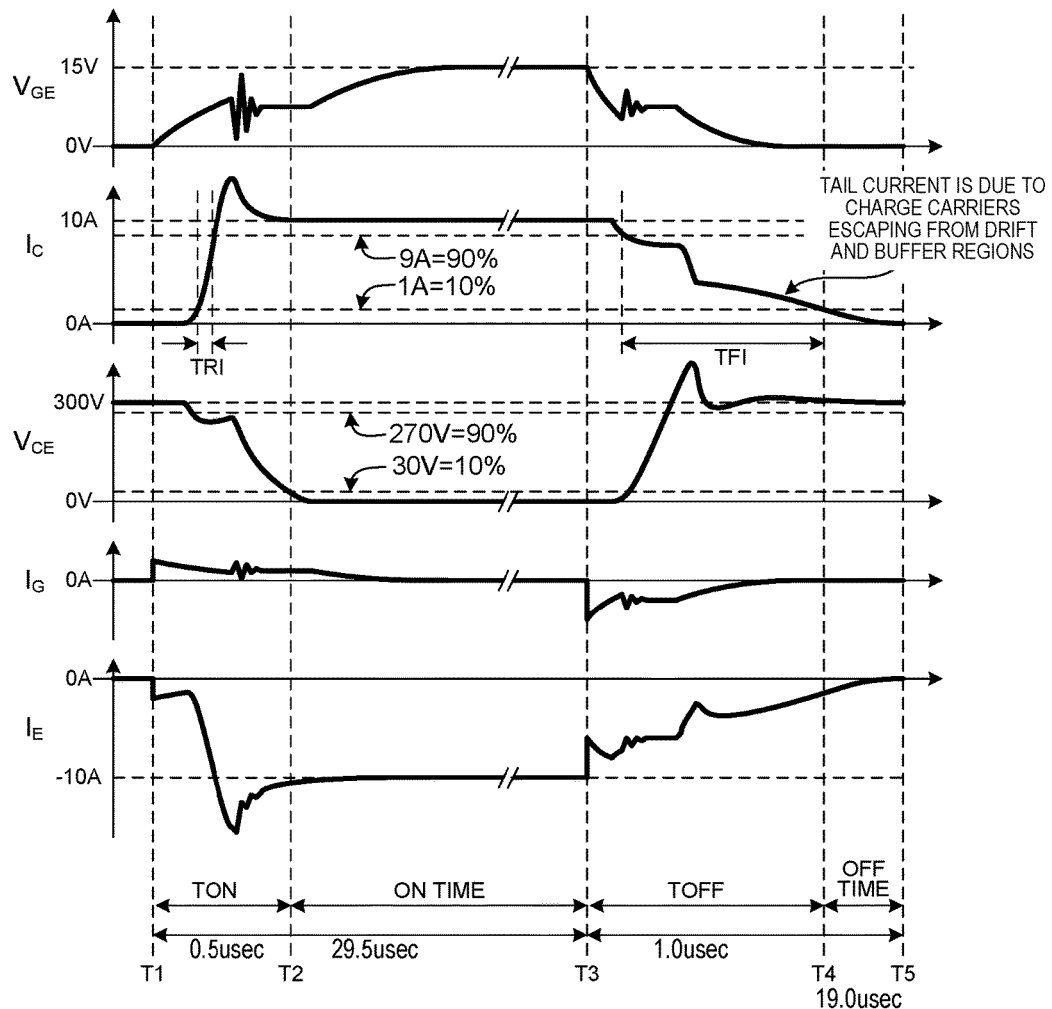
FIG. 31 is a waveform diagram that illustrates an operation of a conventional IGBT in use in an application of driving the same inductive load as in the waveforms of FIG. 30.

FIG. 31 is a waveform diagram of an IGBT of similar construction to the IGBT die structure 55 of FIG. 29 driving the same inductive load, except that the IGBT whose operation is depicted in FIG. 31 has no auxiliary P type well region and has no current transformer or circuit 161 injecting or extracting any $I_A$ current to/from the IGBT. The turn on time TON in FIG. 31 is longer than the turn on time TON in FIG. 30. The longer turn on time TON is due to more time being required to establish the electron/hole gas in the N− drift layer of the IGBT than is required in the novel IGBT die structure 55. The turn off time TOFF in FIG. 31 is also longer than the turn off time TOFF in FIG. 30. The longer turn off time TOFF is due to more time being required to remove electrons and holes of electron/hole gas from the N− drift layer of the IGBT than is required in the novel IGBT die structure 55.

Figure 32:
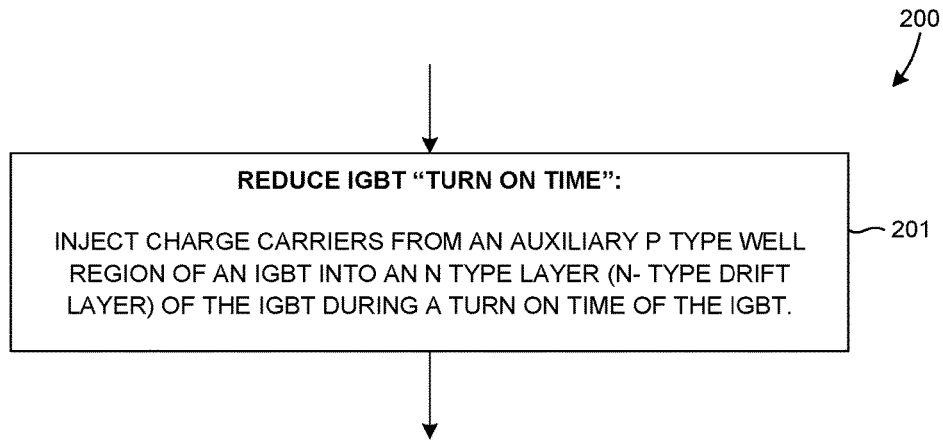
FIG. 32 is a flowchart of a method of reducing IGBT turn on time in accordance with one novel aspect.

FIG. 32 is a flowchart of a method 200 in accordance with one novel aspect. The turn on time TON of an IGBT is reduced by injecting (step 201) charge carriers from an auxiliary P type well region of the IGBT into an N− type drift layer of the IGBT during a turn on time of the IGBT. In one example of the method 200, the IGBT is the IGBT of IGBT die structure 55 of FIG. 6, the auxiliary P type well region is the auxiliary P type well region 66 of the IGBT die structure 55 of FIG. 6, and the N− type drift layer is the N− type drift layer 58 of the IGBT die structure 55 of FIG. 6.

Figure 33:
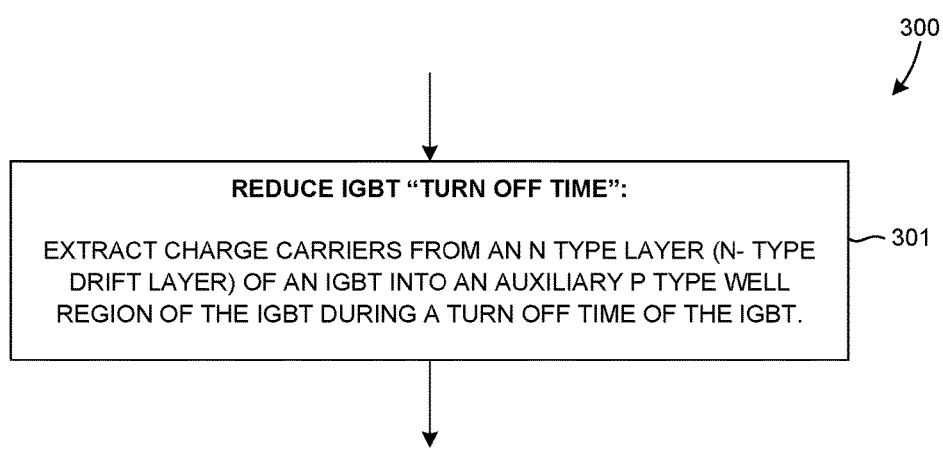
FIG. 33 is a flowchart of a method of reducing IGBT turn off time in accordance with one novel aspect.

FIG. 33 is a flowchart of a method 300 in accordance with one novel aspect. The turn off time TOFF of an IGBT is reduced by extracting (step 301) charge carriers from an N− type drift layer of the IGBT into an auxiliary P type well region of the IGBT during a turn off time of the IGBT. In one example of method 300, the IGBT is the IGBT of IGBT die structure 55 of FIG. 6, the auxiliary P type well region is the auxiliary P type well region 66 of the IGBT die structure 55 of FIG. 6, and the N− type drift layer is the N− type drift layer 58 of the IGBT die structure 55 of FIG. 6.

Although certain specific embodiments are described above for instructional purposes, the teachings of this patent document have general applicability and are not limited to the specific embodiments described above. The disclosed auxiliary P type region and associated terminal that injects/extracts charge carriers into/from an IGBT drift layer is not limited to use in a vertical IGBT structure, but rather applies generally to any IGBT structure or topology. Accordingly, various modifications, adaptations, and combinations of various features of the described embodiments can be practiced without departing from the scope of the invention as set forth in the claims.

What is claimed is:

1. A method of manufacture comprising:
   (a) forming an P type body region that extends into an N type drift layer, wherein the N type drift layer is disposed over a P type substrate layer;
   (b) forming an auxiliary P type well region that extends into the N type drift layer, wherein the auxiliary P type well region and the P type body region are separated from one another by an amount of the N type drift layer;
   (c) forming an N type source region that extends into the P type body region;
   (d) forming a gate;
   (e) forming a first metal terminal, wherein the first metal terminal is coupled to the P type body region and to the N type source region;
   (f) forming a second metal terminal, wherein the second metal terminal is coupled to the gate;
   (g) forming a third metal terminal, wherein the third metal terminal is coupled to the auxiliary P type well region; and
   (h) forming a fourth metal terminal that is coupled to the P type substrate layer, wherein the P type substrate layer, the N type drift layer, the P type body region, the auxiliary P type well region, the N type source region, the first metal terminal, the second metal terminal, the third metal terminal, and the fourth metal terminal are all parts of an Insulated Gate Bipolar Transistor (IGBT) die structure.

2. The method of manufacture of claim 1, further comprising:
   (i) packaging the IGBT die structure in a package such that the first metal terminal of the IGBT die structure is coupled to a first terminal of the package, such that the second metal terminal of the IGBT die structure is coupled to a second terminal of the package, such that the third metal terminal of the IGBT die structure is coupled to a third terminal of the package, and such that the fourth metal terminal of the IGBT die structure is coupled to a fourth terminal of the package.

3. The method of manufacture of claim 1, further comprising:
   (i) packaging the IGBT die structure in a package along with a current injection/extraction circuit.

4. The method of manufacture of claim 3, wherein the packaging of (i) results in: 1) the first metal terminal of the IGBT die structure being coupled to a first terminal of the current injection/extraction circuit, 2) the third metal terminal of the IGBT die structure being coupled to a second terminal of the current injection/extraction circuit, 3) a first terminal of the package being coupled to a third terminal of the current injection/extraction circuit, 4) a second terminal of the package being coupled to the second terminal of the IGBT die structure, and 5) the fourth metal terminal of the IGBT die structure being coupled to a third terminal of the package.

5. The method of manufacture of claim 1, wherein the IGBT die structure has a substantially planar upper semiconductor surface, wherein the P type body region extends from the substantially planar upper semiconductor surface and into the N type drift layer, wherein the N type source region extends from the substantially planar upper semiconductor surface and into the P type body region, and wherein the auxiliary P type well region extends from the substantially planar upper semiconductor surface and into the N type drift layer.

6. A method of turning on an Insulated Gate Bipolar Transistor (IGBT) of an IGBT die structure, wherein the IGBT die structure comprises an IGBT, wherein the IGBT die structure comprises a P type body region that extends into an N type drift layer and also comprises an auxiliary P type well region that extends into the N type drift layer, wherein the IGBT die structure further comprises an N type source region that extends into the P type body region, wherein a first metal terminal of the IGBT die structure is coupled to the N type source region and to the P type body region, wherein a second metal terminal of the IGBT die structure is coupled to a gate, wherein a third metal terminal of the IGBT die structure is coupled to the auxiliary P type well region, and wherein a fourth metal terminal of the IGBT die structure is coupled to a collector of the IGBT, the method comprising:

during a turn on time TON of the IGBT injecting a current into the third metal terminal of the IGBT die structure such that the injected current flows through the third metal terminal and through an auxiliary P type well and into the N type drift layer thereby increasing a concentration of charge carriers in the N type drift layer.

7. The method of claim 6, wherein after the turn on time TON the IGBT operates in a forward conduction mode for an amount of time until a turn off time TOFF of the IGBT, the method further comprising:

maintaining a positive voltage on the third terminal with respect to the first terminal throughout the amount of time that the IGBT is operating in the forward conduction mode.

8. The method of claim 6, wherein after the turn on time TON the IGBT is turned off in a turn off time TOFF, the method further comprising:

during the turn off time TOFF extracting a current out of the IGBT die structure through the third metal terminal such that a concentration of charge carriers in the N type drift layer is decreased due to a current flow from the N type drift layer, through the auxiliary P type well region, and out of the IGBT die structure via the third metal terminal.

9. A method comprising:
(a) injecting charge carriers from an auxiliary P type well region of an Insulated Gate Bipolar Transistor (IGBT) into an N type layer of the IGBT during a turn on time of the IGBT, wherein the IGBT is part of an IGBT die structure that has a first terminal coupled to the auxiliary P type well region of the IGBT, and wherein the IGBT has a P type substrate layer, and wherein the IGBT die structure has a second terminal coupled to the P type substrate layer, wherein the IGBT die structure has four terminals, wherein the first terminal of the IGBT die structure is a collector terminal, wherein the second terminal of the IGBT die structure is a charge carrier injection/extraction terminal that is coupled to the auxiliary P type well region of the IGBT, wherein a third terminal of the IGBT die structure is an emitter terminal, and wherein a fourth terminal of the IGBT die structure is a gate terminal.

10. The method of claim 9, wherein the N type layer is an N-type drift layer.

11. The method of claim 9, wherein during turn on of the IGBT an emitter current flows through an emitter terminal of the IGBT die structure, and wherein during turn on of the IGBT the emitter current changes by approximately twice in magnitude as compared to a change in auxiliary current flowing through the first terminal coupled to the auxiliary P type well region of the IGBT.

12. The method of claim 9, further comprising:
(b) extracting charge carriers from the N type layer of the IGBT into the auxiliary P type well region of the IGBT during a turn off time of the IGBT.

13. The method of claim 12, wherein during turn off of the IGBT an emitter current flows through an emitter terminal of the IGBT die structure, and wherein during turn off of the IGBT the emitter current changes by approximately twice in magnitude as compared to a change in auxiliary current flowing through the first terminal coupled to the auxiliary P type well region of the IGBT.

14. The method of claim 9, wherein the IGBT die structure is part of an IGBT assembly having an emitter transformer lead, a collector lead, and a gate lead, wherein the IGBT assembly is overmolded with an encapsulant to form a packaged device, and wherein the emitter transformer lead, the collector lead, and the gate lead are the only three metal leads that extend outside of the packaged device.

15. The method of claim 14, wherein the packaged device comprises an antiparallel diode and the IGBT assembly, wherein the IGBT assembly includes a current transformer and the IGBT die structure, wherein the emitter transformer lead is coupled to the antiparallel diode, and wherein the emitter transformer lead is also coupled to the current transformer of the IGBT assembly.

16. The method of claim 15, wherein emitter current flowing out of an emitter pad of the IGBT die structure causes energy to be stored in the current transformer of the IGBT assembly, and wherein the current transformer causes auxiliary current to flow back into an auxiliary pad of the IGBT die structure.

17. The method of claim 9, wherein the IGBT die structure is part of an IGBT assembly comprising a current injection/extraction circuit, wherein the IGBT assembly has an emitter transformer lead, a collector lead, and a gate lead, and wherein the emitter transformer lead is coupled to the current injection/extraction circuit.

18. The method of claim 17, wherein a first winding of the current injection/extraction circuit is coupled to the first terminal that is coupled to the auxiliary P type well region of the IGBT.

19. The method of claim 18, wherein a second winding of the current injection/extraction circuit is coupled to an emitter terminal of the IGBT.

* * * * *